United States Patent [19]
Kawashima et al.

[11] Patent Number: 5,619,512
[45] Date of Patent: Apr. 8, 1997

[54] INTEGRATED CIRCUIT HAVING SELF-TESTING FUNCTION

[75] Inventors: Takeshi Kawashima, Obu; Hiroaki Tanaka, Okazaki, both of Japan

[73] Assignee: Nippondenso Co., Ltd., Kariya, Japan

[21] Appl. No.: 337,826

[22] Filed: Nov. 8, 1994

[30] Foreign Application Priority Data

Nov. 8, 1993 [JP] Japan .................................. 5-278300
Feb. 9, 1994 [JP] Japan .................................. 6-037802
Apr. 25, 1994 [JP] Japan .................................. 6-110317

[51] Int. Cl.$^6$ .................................................. G06F 11/00
[52] U.S. Cl. ...................... 371/22.5; 371/25.1; 371/21.1; 371/27
[58] Field of Search .................... 371/22.5, 25.1, 371/25, 22.4, 22.6, 24, 22.2, 21.1, 22.3, 20.5, 20.6; 324/73 R

[56] References Cited

U.S. PATENT DOCUMENTS

| | | | |
|---|---|---|---|
| 4,503,537 | 3/1985 | McAnney | 371/25 |
| 4,513,418 | 4/1985 | Bardell et al. | 371/25 |
| 4,670,877 | 6/1987 | Nishibe . | |
| 5,051,997 | 9/1991 | Sakashita et al. | 371/22.4 |
| 5,173,906 | 12/1992 | Dreibelbis et al. | 371/22.5 |

FOREIGN PATENT DOCUMENTS

| | | |
|---|---|---|
| 62-150874 | 7/1987 | Japan . |
| 238879 | 2/1990 | Japan . |
| 3500344 | 1/1991 | Japan . |
| 433134 | 2/1992 | Japan . |

OTHER PUBLICATIONS

T.W. Williams et al, "Random Patterns within a Structured Sequential Logic Design", IEEE Pub. 77cH1261–7C, pp. 19–27, Oct. 1977.

Hideki Takayasu "Chaos and Fractals", the Proceedings of the Japanese Acoustooptical Society, No. 49, vol. 1, pp. 40–44 (1993).

Franc Brglez et al "Accelerated ATPG and Fault Grading Via Testability Analysis", Proceedings o ISCAS 85, Jun. 1985, pp. 695–698.

John Guckenheimer et al "Introduction to Chaos: Four Examples" Nonlinear Oscillations, Dynamical Systems, and Bifurcations of Vector Fields, pp. 92–95.

Kozo Kinoshita "Recent Development of Design for Testability Technologies for VLSI", vol. 30 No. 12, Dec. 1989, pp. 1451–1459.

Thomas S. Parker et al "Practical Numerical Algorithms for Chaotic Systems", Springer–Verlag.

IEEE/IEE Publications (European Design Automatic Conf, 93).

*Primary Examiner*—Robert W. Beausoliel, Jr.
*Assistant Examiner*—Nadeem Iqbal
*Attorney, Agent, or Firm*—Cushman, Darby & Cushman IP Group of Pillsbury Madison & Sutro LLP

[57] ABSTRACT

A semiconductor device capable of inspecting itself efficiently. Output data from a circuit under test is supplied to a testing data-generating circuit and a non-periodic function transformation is performed so that testing data generated by the testing data generating circuit has a pseudo-random pattern. This pseudo-random pattern is fed back to the circuit under test to continue self-testing. This test is repeated a predetermined number of times that is sufficient to finish all tests for checking the circuit under test. A mathematical function having non-periodic solutions can be realized by a simple rearrangement of various conductive lines so that is is not necessary to previously prepare patterns of testing data.

22 Claims, 30 Drawing Sheets

Fig. 17

| NUMBER OF TEST STEPS | HexAI$_{00}$~AI$_{15}$ | HexBI$_{00}$~BI$_{15}$ | HexOUT$_{00}$~OUT$_{31}$ | NUMBER OF UNDETECTED FAULTS |
|---|---|---|---|---|
| 0 | | | | 5646 |
| 1 | ffff | ffff | fffe0001 | 2738 |
| 2 | 00ff | 81fe | 00817c02 | 1264 |
| 3 | f79e | 7e1f | 79fdc022 | 679 |
| 4 | 917a | a07f | 5b346b86 | 463 |
| 5 | cb86 | a96d | 86b21e0e | 281 |
| 6 | 62cc | 5b9d | 235b1b1c | 199 |
| 7 | accd | 62a9 | 42988d55 | 136 |
| 8 | e55f | fbc0 | e1902c40 | 91 |
| 9 | 379f | ebd7 | 333dab89 | 74 |
| 10 | a905 | 28ee | 1b05eaa6 | 61 |
| 11 | cf02 | 2c7d | 23f96bfa | 46 |
| 12 | a180 | 6263 | 3e117480 | 42 |
| 13 | 8fb7 | 1a1f | 0ea9fd29 | 28 |
| 14 | c119 | 5e0e | 46f1bd5e | 21 |
| 15 | e31c | d281 | babf691c | 17 |
| 16 | 009d | 3869 | 00229865 | 17 |
| 17 | fa5b | 7fb4 | 7ce32cfc | 9 |
| 18 | 9291 | 96d1 | 56589e61 | 6 |
| 19 | ed4b | 9396 | 88cd1af2 | 6 |
| 20 | 55c2 | 74b3 | 2717dea6 | 5 |
| 21 | ae42 | 481d | 31164d7a | 5 |
| 22 | bed8 | 2943 | 1ec28a88 | 4 |
| 23 | c645 | 17ff | 1295b1bb | 4 |
| 24 | e730 | 38aa | 332c05e0 | 2 |
| 25 | a9f3 | 2dc7 | 1e63d2e5 | 1 |
| 26 | ca63 | 1634 | 118d9e1c | 0 |

(e) FROM TIMING ADJUSTING CIRCUIT (a) TO INPUT OF CIRCUIT UNDER TEST

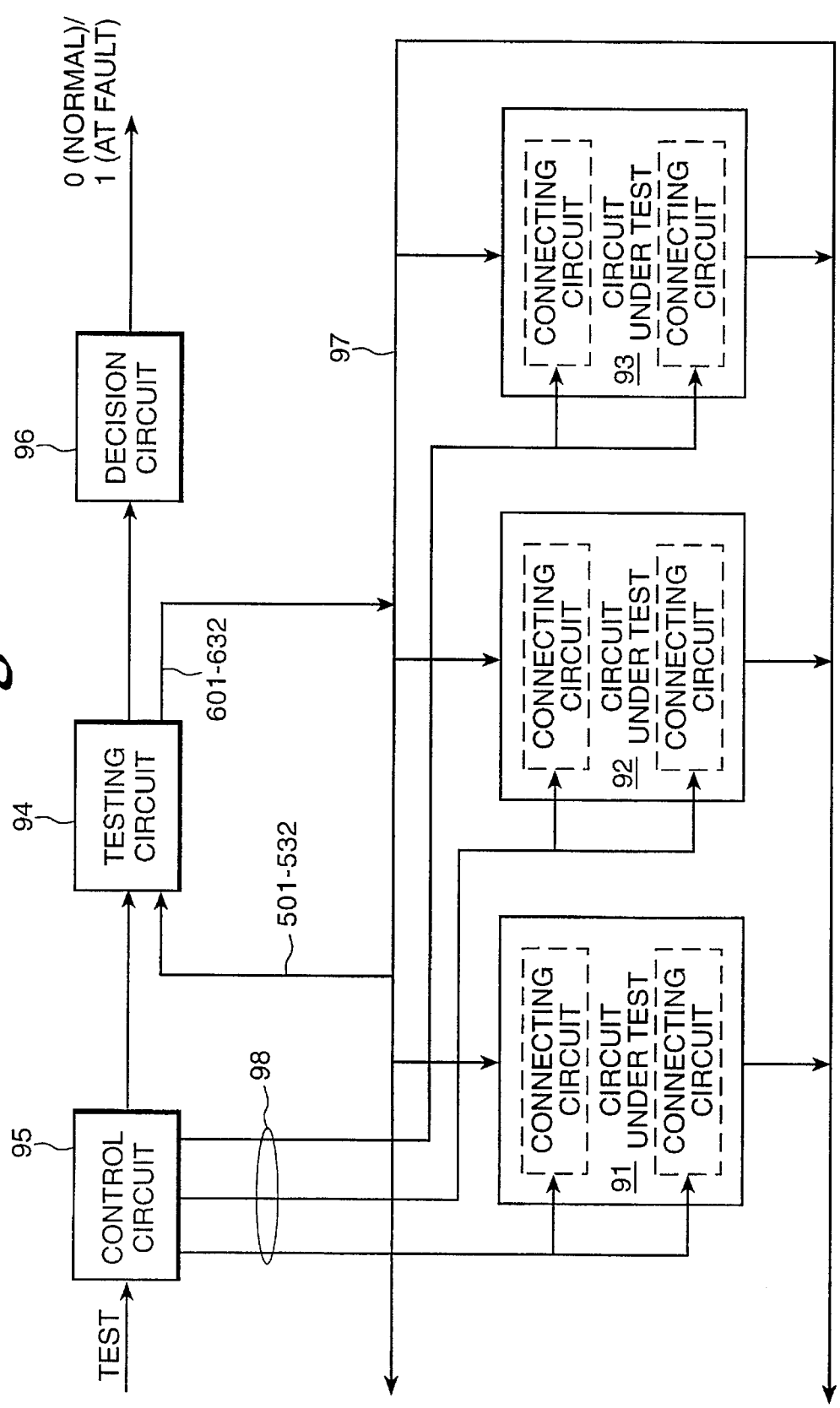

INTEGRATED CIRCUIT HAVING SELF-TESTING FUNCTION

CROSS REFERENCE TO RELATED APPLICATION

This application claims the benefit of priority of the prior Japanese patent applications Nos. 5-278300 filed on Nov. 8, 1993, 6-37802 filed on Feb. 9, 1994, and 6-10317 filed on Apr. 25, 1994, the contents of which are incorporated herein by reference.

BACKGROUND OF THE INVENTION

1. Field of the Invention

The present invention relates to a self-testing semiconductor device such as a large-scale integrated circuit having a self-testing function and, more particularly, to a semiconductor device having a testing function to test itself or a semiconductor device having an testing circuit attached to the outer periphery of the device to inspect it.

2. Description of the Related Art

In recent years, large scale semiconductor devices, such as VLSIs, having greater scales and higher device densities have been manufactured. These new semiconductor devices have full functions and high availabilities. On the other hand, their circuit configurations are complex, and an exorbitant effort of inspection is needed to judge whether each manufactured semiconductor device is operating within normal parameters. Consequently, a considerable amount of time and much labor have been required to this end. For example, a multiplier with a binary 32-bit output is a combinatorial logic circuit having 16 bits×2 inputs and a 32-bit output. This multiplier is a functional LSI comprising AND gates, OR gates, inverters (NOT gates), buffers, switches, etc. The total number of gates reaches about 6500. With a functional check, the number of input data combinations amounts to as many as $2^{32}$. Therefore, even if each data item is checked at a speed of 50 MHz, it takes about 85.9 seconds to complete the testing. Also, it is uneconomical and unrealistic to previously hold such a large amount of data.

Accordingly, in an attempt to solve this kind of problem, so-called self-testing semiconductor devices of various constructions have been proposed as described in Japanese Patent Laid-Open No. 68624/1985. Such a self-testing semiconductor device consists of a chip having a built-in testing circuit. This test is known as a built-in self-test (BIST). These self-testing devices have been put into practical use by various manufacturers since the late 1980s.

The fundamental idea of the built-in testing device is to construct both a testing data generator and a output data compressor inside the chip. More specifically, combinations of input data items generated by the testing data generator are loaded as testing data patterns into each semiconductor device to be inspected. The resultant output of the testing are compressed and compared with the correct data obtained from a normal circuit. In this way, the device is judged whether it is good or not. However, the testing circuit added to the device occupies 5 to 10% of the chip area. Furthermore, the testing time is prolonged. Consequently, the cost of the chip is increased.

It is known that the use of a random data pattern for inspecting each semiconductor device is effective in inspecting circuits as described by T. W. Williams, E. B. Eichelberger in "Random Patterns within a Structured Sequential Logic Design." Dig. of Papers, Semi-conductor Test Symp., IEEE Pub. 77CH1261-7c, pp. 19–27, October, 1977. Therefore, in a proposed inspecting technique, a pseudo-random pattern is generated as a testing data pattern, thus performing testing. In this case, the inspected circuit produces a series of test results on each output line in response to the testing signal, or data about testing. If a fault exists in the circuit under test, the test results are different from expected values. Thus, the test results and the expected values are compared by a decision circuit, which determines whether the circuit is faulty or not. In the case of a large-scale combination logic circuit, the testing results are as large as hundreds of kilo-bits. The results are successively compared with expected values. This needs a large capacity of memory. Therefore, before each comparison, each result of inspection is compressed into several bits by a compression circuit. In the self-testing, a testing mechanism is built into a chip. Hence, it is important that the testing additional circuit be made compact. Even if the additional circuit is made compact, it is necessary to build a pseudo-random number-generating circuit for generating a testing data pattern and a circuit for compressing and comparing the results of testing into the chip, as shown in FIG. 1. Yet, the area occupied by the testing circuit is large. The amount of data about testing is large. In this way, the above-described problem is not yet sufficiently solved.

Japanese Patent Laid-Open No. 150874/1987 shows a circuit shown in FIG. 2. This self-testing circuit has a memory in which data used for inspecting each circuit is stored. Therefore, as the scale of the circuit under test becomes larger, data about inspection increases. As a result, the capacity of the memory must be increased.

In the aforementioned prior art self-testing LSI circuit, self-testing can be performed at a high speed, using a large amount of data about testing. However, a testing control circuit, a testing control memory, a test pattern memory, an arithmetic circuit for testing, a pattern comparator circuit, and a selector must be incorporated into the chip. Consequently, the ratio (hereinafter referred to as the overhead ratio) of the area of the whole testing circuit to the whole chip area is increased. As a result, the area of the LSI is increased.

SUMMARY OF THE INVENTION

It is an object of the present invention to provide a self-testing LSI circuit which exhibits a reduced overhead ratio after semiconductor devices have been packed on the LSI circuit without deteriorating the quality of testing.

In the present invention, in order to generate testing data (testing signal) for inspecting a circuit, the result of the inspection is fed back to the inspected circuit. Although the testing circuit is simple in structure, the circuit converts data into other forms to generate testing data. Referring to FIG. 3, output (c) from a circuit under test is applied as an input (d) to a testing data-generating means (testing circuit). Testing data (a) used in the next step is generated from this signal (d). In this configuration, the function of the compressing circuit, which would have been heretofore required to compress results of testing, can also be performed by the testing data-generating means (testing circuit). Hence, testing hardware can be dispensed with.

In a first embodiment of the invention, a self-testing integrated circuit comprises at least one circuit under test and a testing circuit for performing self-testing. This self-testing integrated circuit is characterized in that the testing circuit is equipped with a testing data-generating means, which takes all output data items from the circuit under test as an input pattern and automatically creates an output pattern from the input pattern, the output pattern being used as testing data about the inspected circuit. Each different output pattern corresponds to each input pattern applied to the testing circuit. The testing data is created repeatedly. The correlation coefficient of these successively created testing data is sufficiently small.

In a second embodiment of the invention, a self-testing integrated circuit comprises at least one circuit under test and a testing circuit for performing self-testing, the self-testing integrated circuit being characterized in that the testing circuit is equipped with a testing data-generating means for automatically generating testing data z, using all output data items y from the circuit under test, and for supplying the data z back to the circuit under test. Let x be data applied to the inspected circuit in an initial stage or previously. It is assumed that the input data x is mapped into the output data y. A function f relating y to x is given by $$y=f(x) \tag{1}$$

within the ranges of possible values of x and y. Thus, the function f (x) is a one to one mapping or an onto mapping. A function describing creation of testing data by the testing circuit is given by $$z=g(y) \tag{2}$$

Thus, this function is also a one to one mapping or an onto mapping. A combined function given by $$z=g(f(x))=h(x) \tag{3}$$

has discontinuity. At two very close points $x_1$ and $x_2$ within the range of the x, the function has the following property $$|h(x_1)-h(x_2)|>|x_1-x_2| \tag{4}$$

In the structure described thus far, the testing circuit may be wiring in which the pattern of input signal lines for entering an input pattern into the testing circuit and the pattern of output signal lines for producing an output pattern are interchanged. Alternatively, some or all of the outputs of the testing circuit and the lines of the wiring may be provided with inverters.

If data about the output from the inspected circuit is directly applied to the testing data-generating means, and if an non-periodic function transformation is effected, then the output testing data assumes a pseudo-random pattern, which is fed back to the circuit under test. The self-testing is continued and repeated up to a previously known number at which the whole testing is completed. In this way, the circuit under test is checked for all considerable faults. A function having non-periodic solutions can be realized with various simple reconnections of conductive lines, by the use of inverters, and other means. The non-periodicity is supported by the chaos theory. Since the output from the circuit under test is fed back to the testing input, it is not necessary to previously prepare a pattern of data for testing.

If this feedback system maintains a non-periodic conversion as a whole, the pseudo-random property is assured. Usually, the relation between the input and the output of an circuit under test is nonlinear and pseudo-random. Therefore, the function transformation of the circuit under test can be a simple nonlinear transformation. In some cases, the purpose can be performed if the function transformation is a linear transformation. Since the relationship between the input and the output of the circuit under test can be known in advance, the function transformation of the circuit under test can be previously selected. The desired function transformation can be realized by reconnections of conductive lines, using inverters, or employing a simple circuit.

If the number of the input data signal lines to the circuit under test and the number of the output data signal lines from the circuit under test do not agree with the number of the corresponding lines to and from the testing circuit, e.g., if the number of the output signal lines from the circuit under test is fewer than the number of the lines from the testing circuit, then their numbers are made to agree with each other, using a logic circuit. If the number of bits treated by the circuit under test is larger than the number of bits treated by the testing circuit, then the signal line number is expanded such that one input signal line corresponds to plural output signal lines. This maintains randomness of the testing data. If it is impossible to inspect the circuit under test with one testing circuit, a structure comprising a selector for changing the connected outputs may be added. In this case, it is possible to cope with a plurality of different inspected circuits.

These testing circuits can be formed on the same chip, together with the circuit or circuits under test. Each individual semiconductor device can be smoothly inspected. Where an external testing circuit is provided, the chip area can be reduced further. Also, the costs of the chips can be lowered.

In a third embodiment of the invention, a self-testing semiconductor device, especially a self-testing semiconductor integrated circuit, comprises at least one circuit under test, a testing circuit, a selecting means, a decision circuit, and a control circuit. The testing circuit comprises a data output means for producing testing data to the circuit under test, a data-generating means for automatically creating new testing data from the output data from the circuit under test, and an initial values entry means for accepting and establishing only a first set of testing data at the beginning of a series of inspections. The selecting circuit selects either an input signal produced in normal use or testing data obtained from the circuit under test during inspection. The decision circuit determines whether the inspected circuit is faulty or not, based on the testing data produced from the testing circuit when the series of inspections is completed, i.e., when an inspection process is repeated a given number of times. During inspection, the control circuit controls the testing circuit, the initial value entry means, the selecting circuit, and the decision circuit. The testing circuit comprises a linear feedback shift register and a testing data-generating means for automatically generating new testing data from the output data from the circuit under test and from the linear feedback shift register.

In response to a signal indicating start of inspection, the initial value entry means establishes a first set of testing data, or the initial values of testing data, and this first set of testing data is supplied to the circuit under test. Then, the initial value entry means is disconnected. Thereafter, the testing data is arithmetically processed by the inspected circuit. The results of the arithmetic processing are delivered. The testing circuit is composed of the linear feedback shift register. Thereafter, only clock pulses are applied to the shift register. Data about the results of the arithmetic processing is compressed by the shift register. The compressed data is supplied as next testing data again to the circuit under test. Then, the next test is performed. In this manner, the testing circuit again automatically generates next testing data, using the results of calculations performed by the circuit under test. When the preset number of clocks are carried out, the results of inspection performed by the circuit under test are compared with expected values. The decision circuit makes a decision as to whether the circuit under test is normal or at fault.

In the self-testing LSI circuit of the third embodiment described above, the output from the circuit under test is applied to the testing circuit. New testing data to be supplied to the circuit under test is generated from the output from the testing circuit. The circuit under test is tested, based on the testing data. As a result, the amount of data necessary for the inspection can be reduced greatly. Testing data which would have been carried out by separate configurations, e.g., a test data generator and an output data compressor by the prior art techniques, is processed by the single testing circuit. This testing circuit effects both generation and compression of data. Thus, inspection is done quickly. Consequently, a self-testing circuit can be easily built without impairing the quality of the inspection. Also, the area of the circuit for the inspection can be decreased. Furthermore, because the testing circuit is made of the linear feedback shift register, the self-testing circuit can be readily accomplished, irrespective of the number of input signal lines to the inspected circuit or the number of output signal lines from the circuit under test. Where the testing circuit is provided externally, inspection can be quickly and automatically completed.

BRIEF DESCRIPTION OF THE DRAWINGS

Other objects, features and characteristics of the present invention will be appreciated from a study of the following detailed description, the appended claims, and drawings, all of which form a part of this application. In the drawings:

FIG. 17 is a table of data items used by the testing circuit shown in FIG. 6 to generate testing data for the circuit under test shown in FIG. 4;

FIG. 39 is a diagram of a twelfth embodiment of the invention.

DETAILED DESCRIPTION OF THE PREFERRED EMBODIMENTS

The preferred embodiments of the present invention are described below. The inventive self-testing is hereinafter referred to as the Feedback Built-In Self-Test (FB-BIST).

(First Embodiment)

Figure 1:
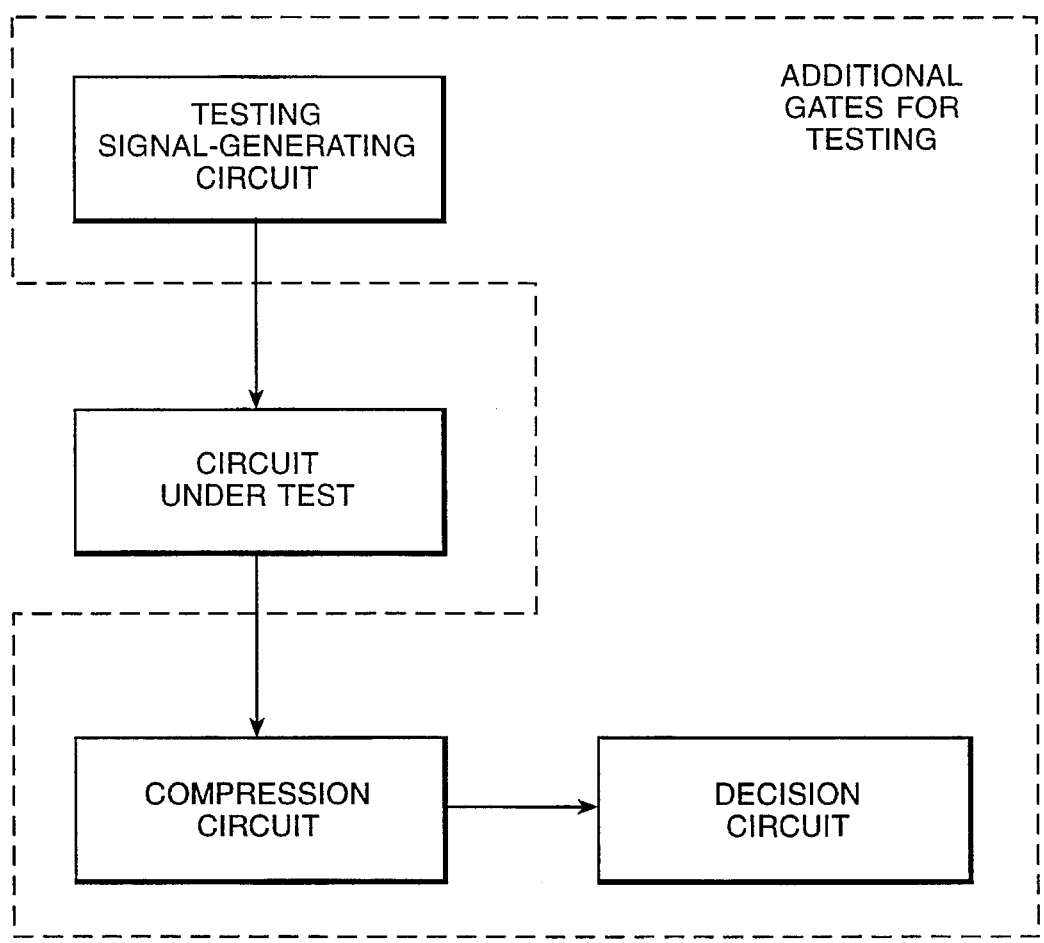
FIG. 1 is a block diagram of a known self-testing circuit.
Figure 2:
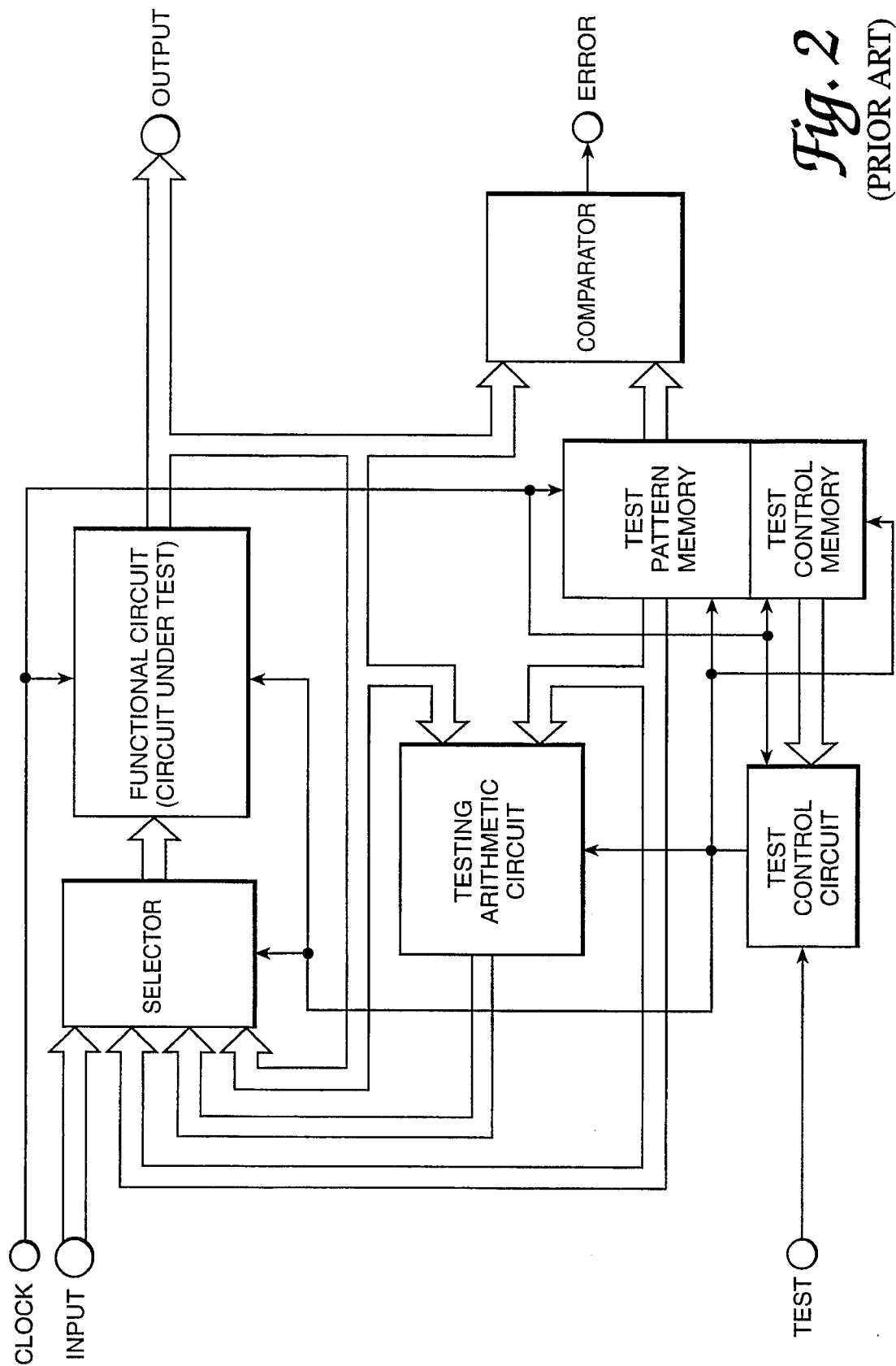
FIG. 2 is a block diagram of another known self-testing circuit.
Figure 3:
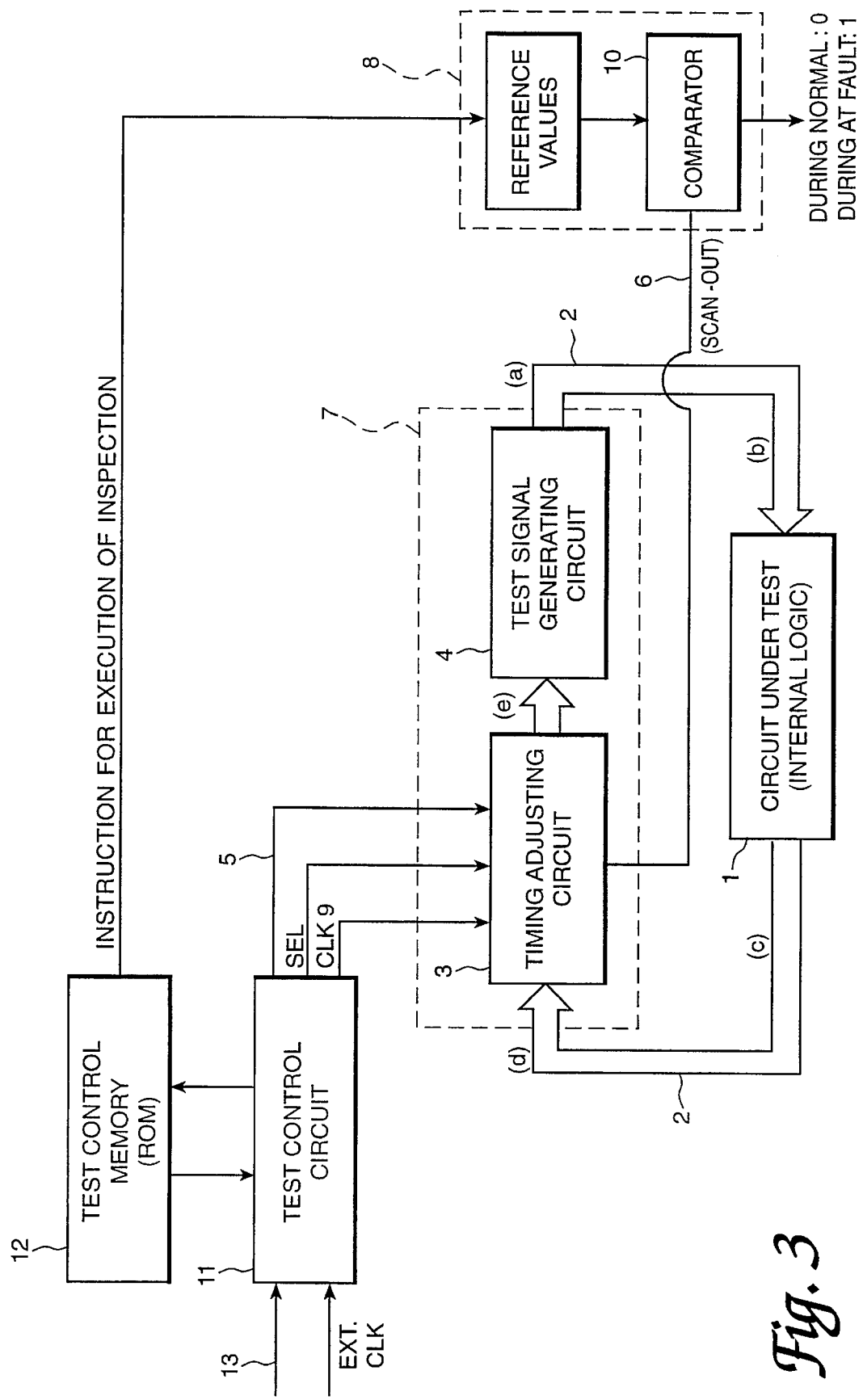
FIG. 3 is a block diagram of a self-testing semiconductor integrated circuit according to the present invention.

FIG. 3 is a diagram illustrating a first embodiment of the invention. A circuit 1 to be inspected (tested) is a semiconductor device. A testing circuit 7 sends a signal to a testing signal-generating circuit 4 via a timing adjusting circuit 3 through an internal bus I/O data bus, or test bus 2 in response to output data from the circuit under test 1 to cause the testing signal-generating circuit 4 to generate data about testing (hereinafter often referred to as the testing data). The testing data is supplied to the circuit under test 1 through the internal bus 2. The testing circuit 7 is composed of the timing adjusting circuit 3 accepting the output data from the circuit under test 1 and the testing data-generating circuit 4 that converts the output from the timing adjusting circuit 3 into new next step testing data, using a mathematical function. At the start of an inspection, an initial data is supplied to the timing adjusting circuit 3 through SCAN-IN 5, which then generates first testing data. Subsequently, the timing adjusting circuit 3 automatically generates testing data in response to the output data from the circuit under test 1. Thus, the inspection is repeated in response to clock pulses (CLK) 9. After the whole inspection is done, the output 6 from the testing circuit 7, which indicates the result data of the inspection, is sent to a decision circuit 8.

Figure 4:
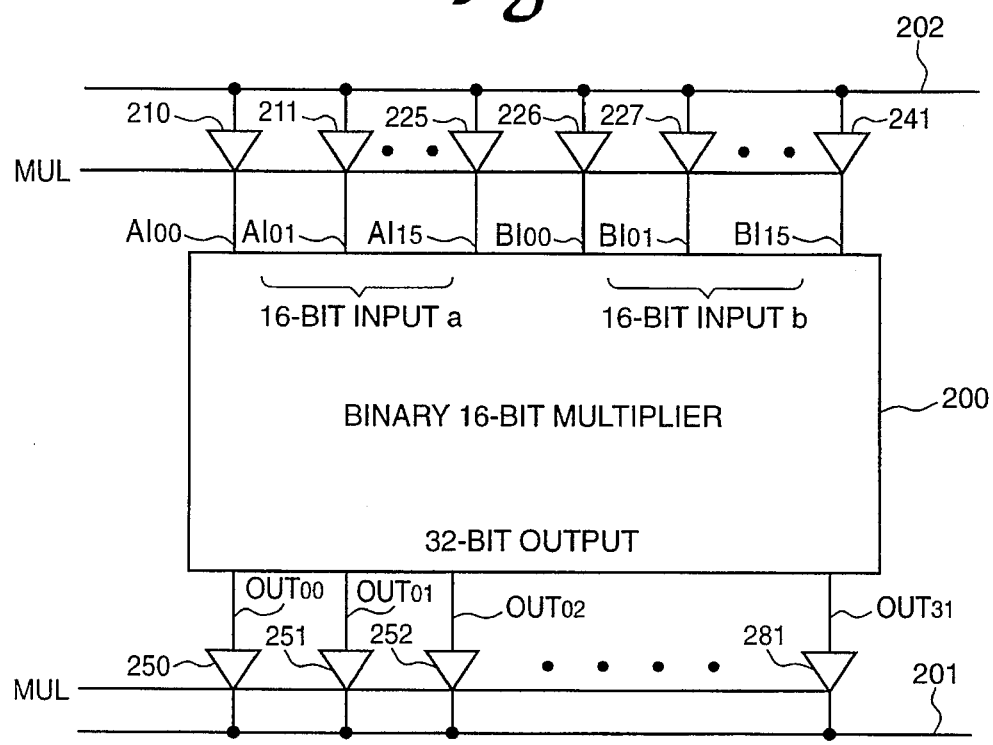
FIG. 4 is a diagram of a multiplier which is one example of a circuit under test.

As one specific example of the circuit under test 1, a multiplier 200 with two binary 16 bit-inputs and 32-bit output is shown in FIG. 4. During normal functional executions, data is input to enabling circuits 210, 211, ..., 225, 226, 227, ..., 241 which act as latches, through the internal bus 2, or 32-bit bus. The input side of this bus is indicated by 202, while the output side of the bus is indicated by 201. In response to a signal from a control line MUL located on the input side, the data is accepted into the multiplier 200. This multiplier 200 has input terminals $AI_{00}$–$AI15$ and $BI_{00}$–$BI_{15}$. The former set of input terminals $AI_{00}$–$AI_{15}$ forms a 16-bit input a, while the latter set of input terminals $BI_{00}$–$BI_{15}$ forms a 16-bit input b. The multiplier performs a multiplication of these inputs a and b, and the resulting product is produced as binary 32-bit outputs $OUT_{00}$–$OUT_{31}$. These outputs are latched in enabling circuits 250, 251, 252, ..., 281 in response to a signal from a signal line MUL located on the output side. These outputs are also produced to the 32-bit internal bus 201 that is also 202.

Figure 5:
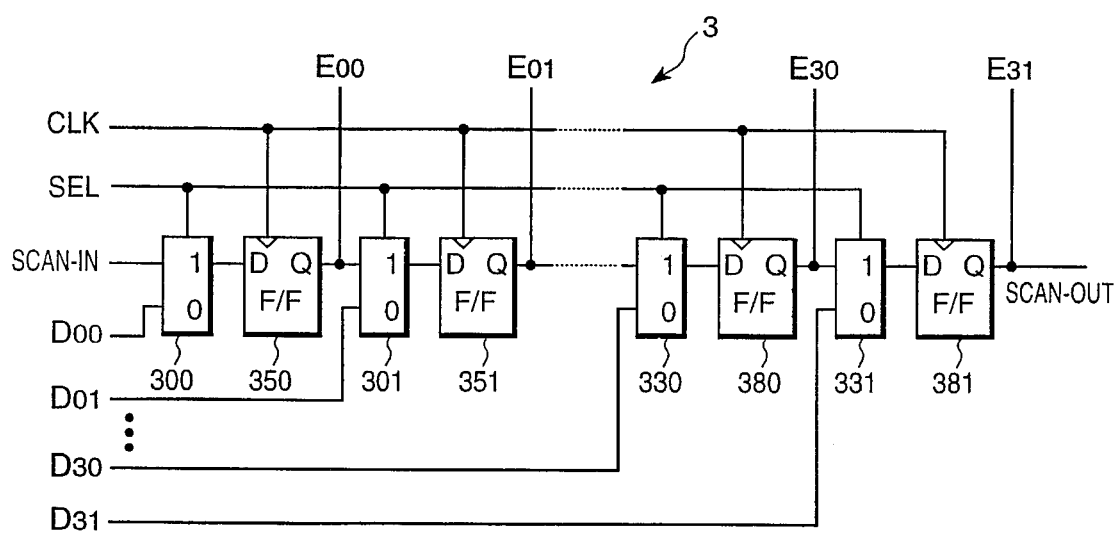
FIG. 5 is a diagram of one example of a timing adjusting circuit included in the circuit shown in FIG. 3.

During inspection of the multiplier 200, the testing circuit 7 shown in FIG. 3 generates the testing data from data about the results of the calculation performed by the multiplier 200. The timing adjusting circuit 3 of the testing circuit 7 comprises selectors 300, 301, ..., 331, flip-flops 350, 351, ..., 380, 381, and signal lines (SCAN-IN) for introducing external clock pulses (CLK), a control signal (SEL), and initial values. As shown in FIG. 5, the selectors 300, 301, ..., 331 are connected in series. The number of these selectors is equal to the required number of bits, or 32 bits. The 32 flip-flops are connected similarly. Signal lines $D_{00}$–$D_{31}$ are connected to the I/O data bus 201 through which the output from the multiplier 200 is introduced. When the signal line SEL is at low level, the selectors 300–331 send the values of the signal lines $D_{00}$–$D_{31}$ to the flip-flops. When the signal line SEL is at high level, the selectors deliver the values of the flip-flops without modifying them. The outputs Q's of the flip-flops form outputs connected with lines $E_{00}$–$E_{31}$, which are in turn connected with the testing data-generating circuit 4. When initial values are established, this signal line SEL is used to introduce data from the signal lines SCAN-IN.

Figure 6:
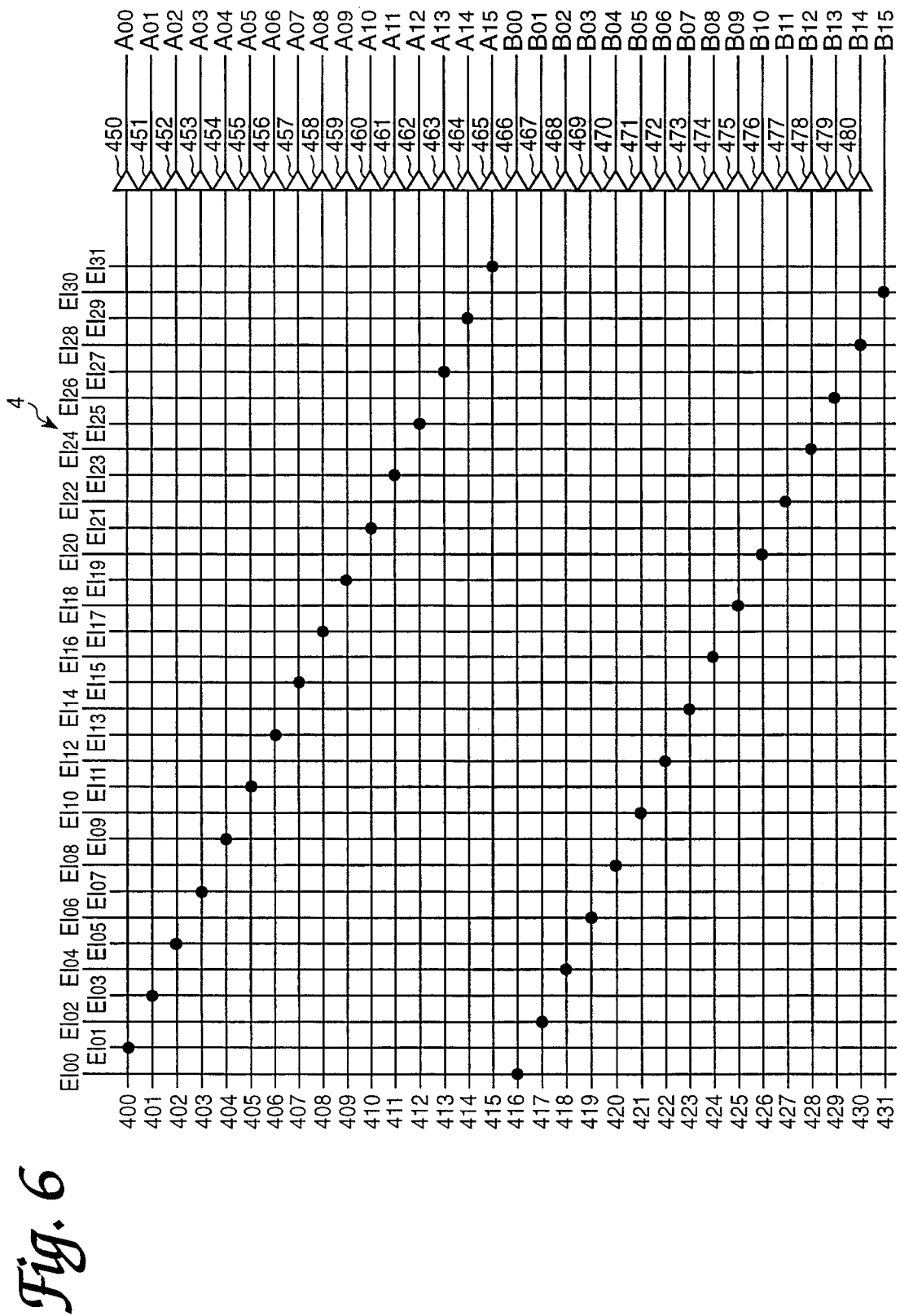
FIG. 6 is a diagram of a testing data-generating circuit for use with the multiplier shown in FIG. 4.

The original data used for generation of the testing data and produced from the timing adjusting circuit 3 is supplied to the testing data-generating circuit 4, which converts the original data into new testing data, using a mathematical function. In order to realize a non-periodic and onto mapping transformation of the testing circuit, the function used for the transformation is implemented by a circuit configuration consisting of conductive lines and inverters shown in FIG. 6. In FIG. 6, inputs $EI_{00}$–$EI_{31}$ are connected from the timing adjusting circuit 3. The testing data is produced to outputs $A_{00}$–$B_{15}$, which are connected with the multiplier 200. Of the output bits, $A_{00}$–$B_{14}$ are equipped with inverters 450–480, respectively.

Figure 7:
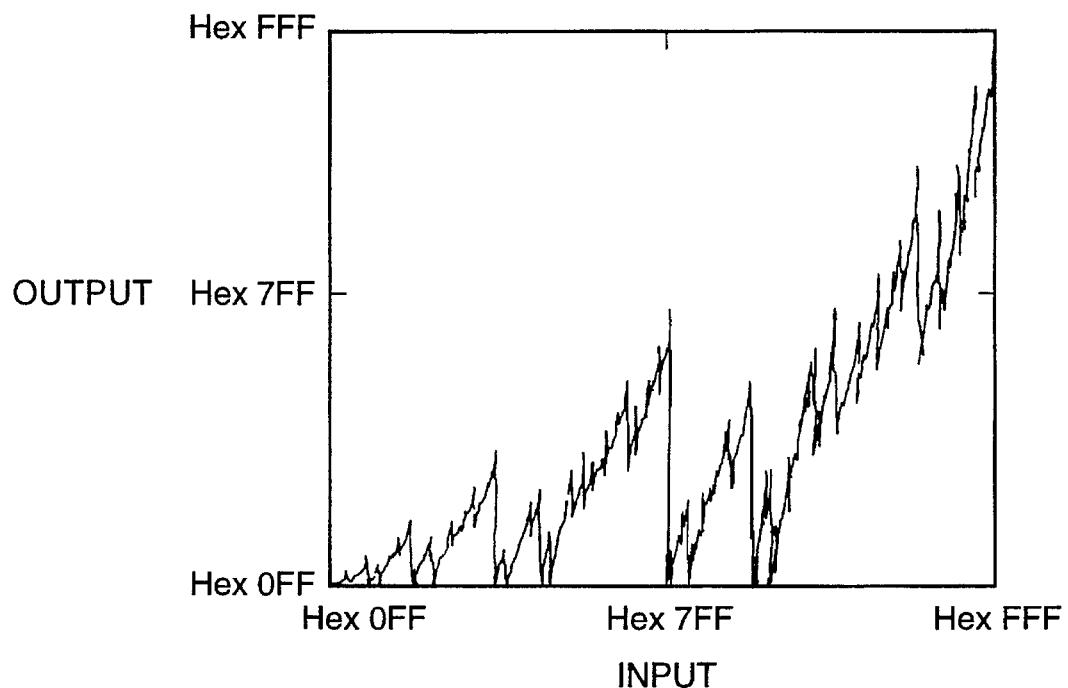
FIG. 7 is a graph showing the characteristics obtained when the input connection pattern and the output connection pattern of the multiplier shown in FIG. 4 are interchanged.
Figure 8:
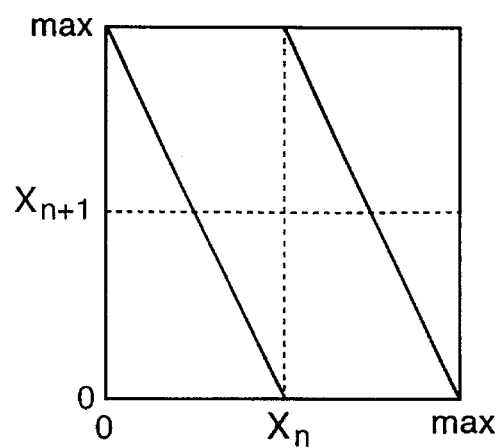
FIG. 8 is a diagram illustrating feedback mapping for a multiplier.

The transformation performed by the circuit shown in FIG. 6 is described in detail. The original data supplied to this circuit are output values from the multiplier 200, excluding the initial values. Therefore, as can be seen from the structure of the multiplier shown in FIG. 4, the inputs a and b are input in parallel. As a result, the output from the multiplier is complex. Accordingly, the original data bits are rearranged into the form $B_{00}, A_{00}, \ldots, B_{15}, A_{15}$ so that the results of an inspection obtained when the multiplier is regarded as mapping, or a function, approach y=x (output= input), as shown in FIG. 7. The rearranged data bits are multiplied by a factor of $-2$ ($y=-2x-1$ [$-1<x<0$]; $y=-2x+1$ [$0<x<1$]; x and y assume forms normalized into $[-1, 1]$ as shown in FIG. 8) to accomplish non-periodic transformation. The data bits excluding $B_{15}$ are inverted by the inverters because $B_{15}$ is regarded as disturbances.

In order for the above-described circuit to realize a non-periodic function, the following must be considered. First, in order to carry out inspections by an algorithm utilizing the feedback system, the inspection mechanism must satisfy the following three conditions (see FIG. 3):

(1) The testing data (a) used in the next step and generated from the output (c) from the inspected circuit 1 by the testing data-generating circuit 4 is a random pattern;

(2) When the output (c) from the circuit under test 1 indicates a fault, i.e., when the results from inspections are different from normal results, a test signal (a) used in the next step and generated from the output (c) from the circuit under test 1 by the testing data-generating circuit 4 assumes a value different from normal values; and (3) Once the output (c) from the circuit under test assumes a different value, the correct signal will not be regained until the inspection ends while the feedback process is being repeated.

The conditions (2) and (3) above are necessary in order that a fault found during the inspection not be omitted when the fault subsequently passes through the testing circuit a plurality of times. That is, the fault aliasing probability must be low enough for practical use. The condition (3) is imposed because the testing data-generating circuit and the circuit under test are regarded as a feedback system.

That is, the testing data-generating circuit should be built so as to meet these three conditions. For this purpose, the mathematical chaos theory is applied. Complex, unpredictable time variations caused by nonlinear deterministic systems are collectively referred to as chaos. A chaotic system has the following features:

(1) If the initial values differ slightly, the trajectories of solutions differ very widely (instability of trajectories);

(2) Long-term prediction is impossible (long-term unpredictability); and (3) Solutions do not have clear periodicity (non-periodicity of solutions).

These are described by Hideki Takayasu in "Chaos and Fractals", the Proceedings of the Japanese Acoustooptical Society, No. 49, Vol. 1, pp. 40–44 (1993).

The testing data-generating circuit is constructed by making use of these features of chaos in such a way that the feedback system consisting of a combination of the circuit under test and the testing data-generating circuit forms a chaotic system as a whole. If initial values are appropriately selected, the input data to the circuit under test forms a random pattern, thus satisfying the condition (1) above. Since a slight variation in the output is increased with progress of inspecting steps, the condition (2) is also catered for. Furthermore, since long-term prediction is impossible, it can be considered that the autocorrelation of the testing data is lost with progress of inspecting steps. Once different testing data is delivered, the possibility that the normal signal is regained is very low. For these reasons, a circuit can be effectively inspected if the inspecting mechanism consisting of a feedback system constitutes a chaotic system.

Figure 9:
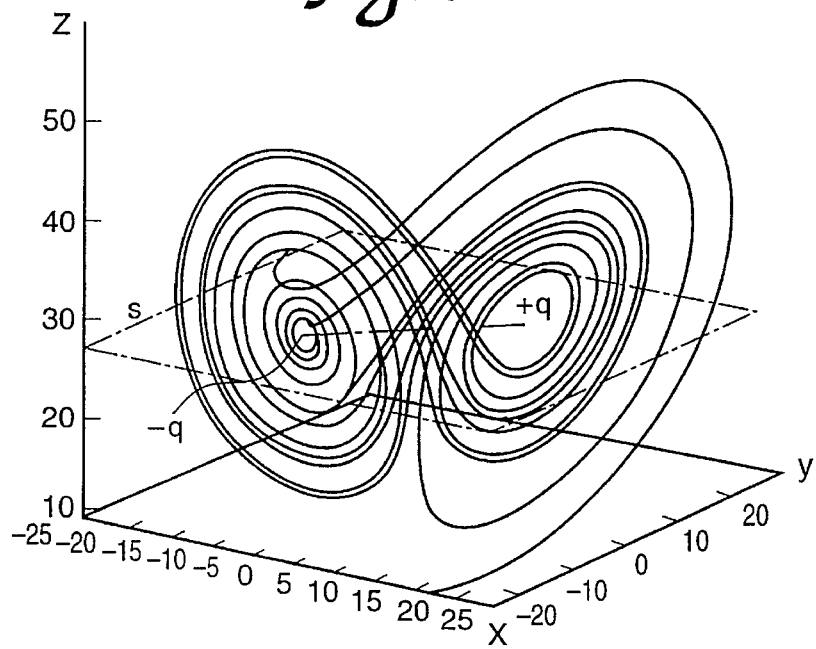
FIG. 9 is a diagram illustrating one numerical solution of the Lorenz equations.

We now take the Lorenz equations as examples of means for forming a circuit for creating testing data, based on the chaos theory. The Lorenz equations are given by $$dx/dt = \sigma(y-x)$$

$$dy/dt = \rho x - y - x z \quad (5)$$

$$dz/dt = -\beta z + xy$$

where $\sigma$, $\rho$, and $\beta$ are positive constants (Thomas S. Park and Leon O. Chua: "Practical Numerical Algorithms for Chaotics Systems"; John guckenheimer and Philip Holmes: "the Lorenz Equation" from their book *Nonlinear Oscillations, dynamical Systems, ane Bifurcations of Vector Fields*; both Springer-Verlag). It is known that these equations represent chaos. Numerical solutions obtained under the conditions that the parameters $\sigma=10$, $\rho=\frac{8}{3}$, and $\beta=28$, are illustrated in FIG. 9. It can be seen that a complex solutions exist. In particular, with lapse of time, the orbits of numerical solutions go around two unstable equilibrium points $+q$ and $-q$ without diverging (feature (3)). These solutions of the orbits are very unstable, and the orbits are varied quite greatly even if a quite small perturbation is applied (feature (1)). Since numerical solutions obtained by a computer involve round-off errors, variables x, y, and z can be found only at a finite accuracy. Consequently, in a continuous time system, if a long time passes, the prediction of the orbits is impossible (feature (2)).

Figure 10A:
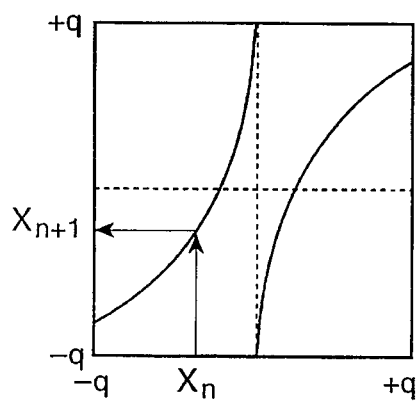
FIG. 10(a) is a diagram illustrating Lorenz mapping.

In FIG. 9, a plane S contains a straight line connecting two equilibrium points $+q$ and $-q$ and is parallel to a plane $z=0$. A point $x_n$ crosses the plane S n times. Let $x_{n+1}$ be a point at which the point $x_n$ then crosses the plane S close to the straight line. The point $x_n$ (n=1, 2, ... ) is projected onto the straight line connecting the two equilibrium points $+q$ and $-q$. In this way, the point $x_n$ is projected onto the point $x_{n+1}$. This is Lorenz mapping f shown in FIG. 10(a). The Lorenz mapping is one example of Poincaré section described by the mathematical chaos theory. The function shown in FIG. 10(a) is a completely nonlinear function, and it is difficult to realize this with an actual circuit. Therefore, we consider a simplified function as shown in FIG. 10(b), where linear functions of gradient 2 are partitioned to form nonlinear mappings.

Figure 10B:
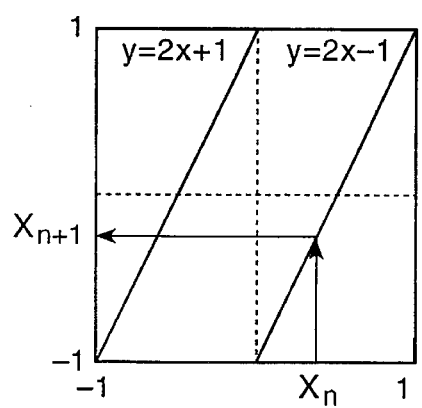
FIG. 10(b) is a diagram illustrating simplified Lorenz mapping.
Figure 11A:
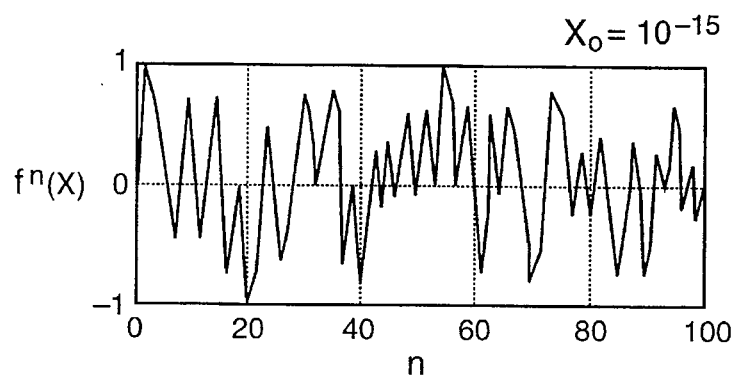
FIGS. 11(a) and 11(b) are a diagrams illustrating the non-periodicity of Lorenz mapping.
Figure 11B:
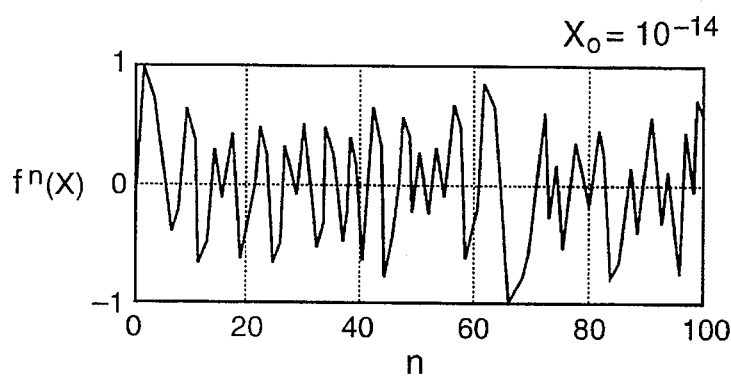

FIG. 10(b) is a simplified mapping of FIG. 10(a). In FIG. 10(b), where the initial value $x_0$ differs slightly, the value of n is increased such that n=1, 2, ... The resulting $x_n$ are shown in FIGS. 11(a) and 11(b). Since Lorenz mappings are intrinsically found from solutions of the Lorenz equations, these mappings preserve the features (1), (2), and (3) above. The initial value $x_0$ is varied slightly, and mapping f is iterated n times. Under this condition, $f^n(x)$ differ widely with increasing n. More specifically, let $x_1$ and $x_2$ be two points located very close to each other. With respect to $x_0$, the relation $$|f(x_1)-f(x_2)|>|x_1-x_2|$$

holds. Of course, in the case of FIG. 10(b), the features are preserved approximately.

Figure 12A:
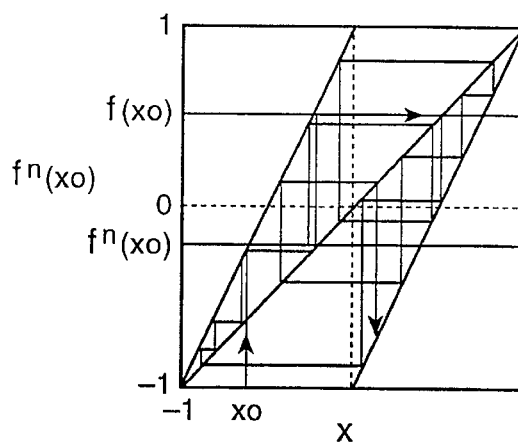
FIGS. 12(a and 12(b) are diagrams illustrating the theory of the non-periodicity illustrated in FIGS. 11(a) and 11(b)
Figure 12B:
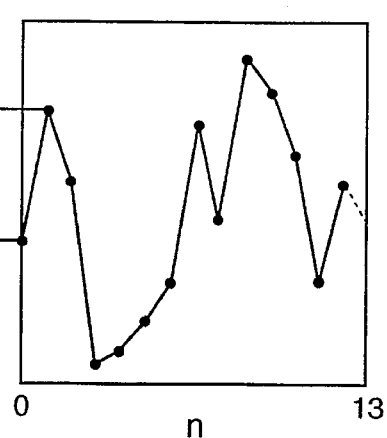
Figure 13A:
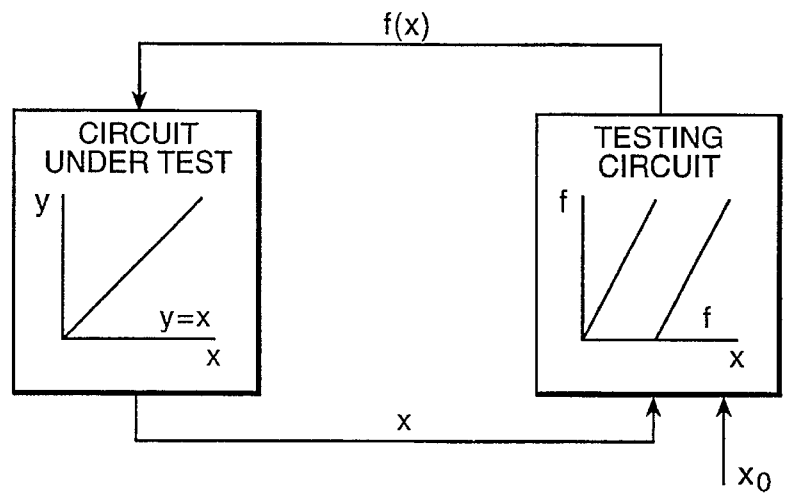
FIGS. 13(a) and 13(b) are diagrams illustrating the correspondence between a feedback system and Lorenz mapping.
Figure 14:
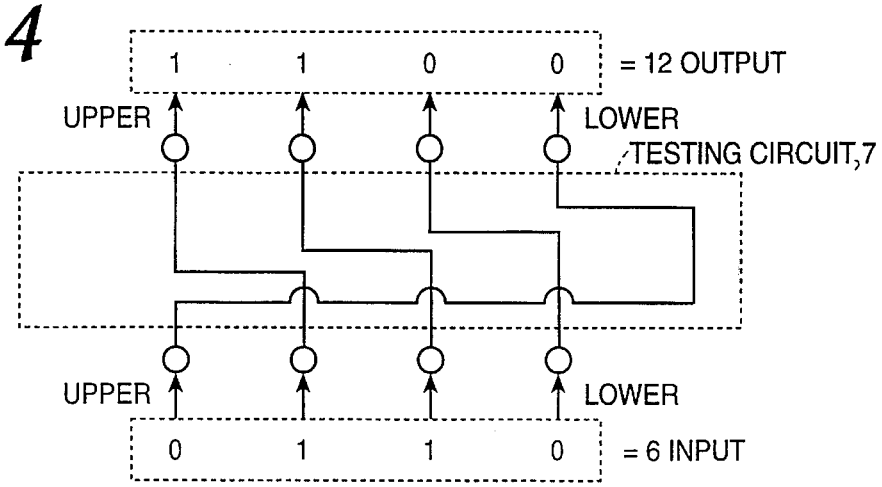
FIG. 14 is a diagram of a conversion circuit for accomplishing simplified Lorenz mapping.

When the mappings shown in FIGS. 11(a) and 11(b) are viewed from a viewpoint of feedback, iteration of mapping f forms a bent vortex as shown in FIG. 12(A). The relation between the vertical axis f(x) and the horizontal axis n is a random pattern shown in FIG. 12(B). That is, as shown in FIG. 13(a), it follows that $f^n(x_0)$ is fed back to x with straight line y=x. This is compared with the structure shown in FIG. 3. If the relation y=x exists between the input and the output of the inspected circuit, an approximate chaotic system can be created by forming the testing circuit whose input-output characteristics are given by the mapping f and forming a feedback system, or FB-BIST. This testing circuit is connected so that the output from the testing circuit is shifted by one bit (i.e., doubled) with respect to the input, as shown in FIG. 14, and inserting the upper bits of the input into the lower bits of the output. Hence, the testing circuit can be easily constructed.

However, in the case of an ordinary logic circuit, the proportional relation does not always exist between the input and the output of the circuit under test. Rather, a function providing only such a proportional relation does not exist. At this time, the input and output of the circuit under test can be regarded as having one kind of randomness. In this case, if the following conditions are satisfied, the feedback system can be made a chaotic system, and inspection can be done:

(A) The feedback system consisting of the testing circuit and the circuit under test has at least one non-periodic solution. This corresponds to the condition (1) mentioned above.

(B) Mapping of the input x of the circuit under test onto the output y yields a one to one correspondence. Alternatively, a large number:1 correspondence exists within a range in which the fault aliasing probability is sufficiently low for practical use. This corresponds to the condition (3) mentioned above.

(C) Mapping of the input x of the circuit under test onto the output y is an onto mapping of y. This corresponds to the condition (3) mentioned above.

(D) Even if this condition (C) is not satisfied, the value of each signal line of the output y varies to such an extent that inspection is possible. This corresponds to the condition (3) mentioned above.

Figure 13B:
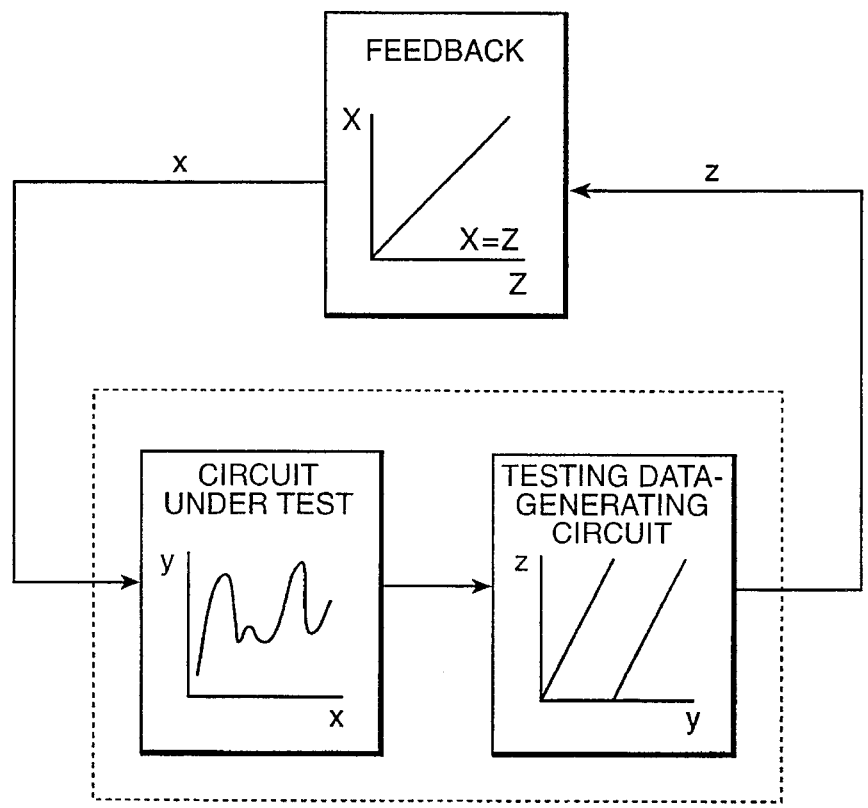

These conditions mean that the combination of the circuit under test and the testing circuit is regarded as one integrated transformer that is a chaotic system, as shown in FIG. 13(b). That is, the testing data is entered into the circuit under test, and results of an inspection are delivered. The results are then converted by the testing data-generating circuit into new testing data. If this new testing data forms a pseudo-random pattern, then the inspection is possible.

That the data is a pseudo-random pattern is confirmed by the testing circuit in the manner described now. The correlation coefficient C between some testing data and next testing data which is produced from the circuit under test in response to the previous testing data is found and compared as follows.

$$C = \frac{nr - S_1^2}{ns_2 - s_1^2} \tag{6}$$

where $$r = x_1x_2 + x_2x_3 + \ldots + x_{n-1}x_n + x_n x_1 \tag{7}$$

$$s_1 = x_1 + x_2 + \ldots + x_n \tag{8}$$

$$s_2 = x_1^2 + x_2^2 + \ldots + x_n^2 \tag{9}$$

In the above equations, n is the number of test stages, and $x_1$ is obtained by regarding the inputs <u>a</u> and <u>b</u> to the multiplier 200 as one logic value, representing it in hexadecimal notation, and normalizing Hex 0 through Hex FFFFFFFF to 0–1.

If this correlation coefficient C is approximate to 0, it can be said that these data are random. The testing data-generating circuit shown in FIG. 6 is used with the multiplier 200 shown in FIG. 4. The correlation coefficient is found under the condition n=500. Since C=0.08≈0.0, the testing data generated from the output data from the multiplier 200 are sufficiently random. Also, it is sufficiently possible to cope with the required number of steps of inspection, or the number of iterations of entry of testing data.

A pseudo-random system is realized by making the structure of the testing circuit of FB-BIST chaotic in this way. That is, in the inventive configuration, the chaos theory and correlation coefficient assure randomness of the testing data.

Data used for the above-described correlation coefficient are found in the procedure described below. In the structure shown in FIGS. 3, 4, and 6, initial data is appropriately determined and entered. An inspection is repeated until all stack faults and open faults in the binary 16-bit, multiplier 200 are detected. The relation between the number of testing steps, or the number of applied testing data items, in the multiplier 200 and the undetected fault rate is shown in FIG. 17. With the structures of this multiplier 200 shown in FIG. 4 and of the testing data-creating circuit shown in FIGS. 4 and 6, it is known that every fault can be detected with 26 testing steps in the stage of designing. In actual feedback built-in self-testing (FB-BIST), after the clock pulse at the 26 step rises, the result of the test is accepted into the flip-flops. If the circuit is normal, the result is Hex 118D9E1C of the "OUT" at the end of the list shown in FIG. 17. The decision circuit 8 shown in FIG. 3 compares the result of the test SCAN-OUT 6 with values "118D9E1C" expected in normal state. In this way, the decision circuit 8 makes a decision as to whether the circuit is normal or at fault.

The multiplier 200 is the 32-bit input, 32-bit output combinatorial logic circuit which produces the product of binary 16-bit inputs <u>a</u> and <u>b</u> at its binary 32-bit output. This multiplier consists of AND gates, OR gates, inverters, etc, as mentioned above. The total number of the gates is 6500. Of course, the relation of the output data to input data is not a proportional relation but can be regarded as a complex transformation. Input data items to the multiplier are arranged from lower-order bits such as $b_0, a_0, b_1, a_1, \ldots$ Outputs $Out_0, Out_1, \ldots$ produced when input items 0, 1, . . . are applied are found. In this way, the relation between the input and the output is found as shown in FIG. 7. This clarifies the complex input-output relationship of the multiplier 200. Also, the testing data-generating circuit can be fabricated with greater ease.

Figure 15:
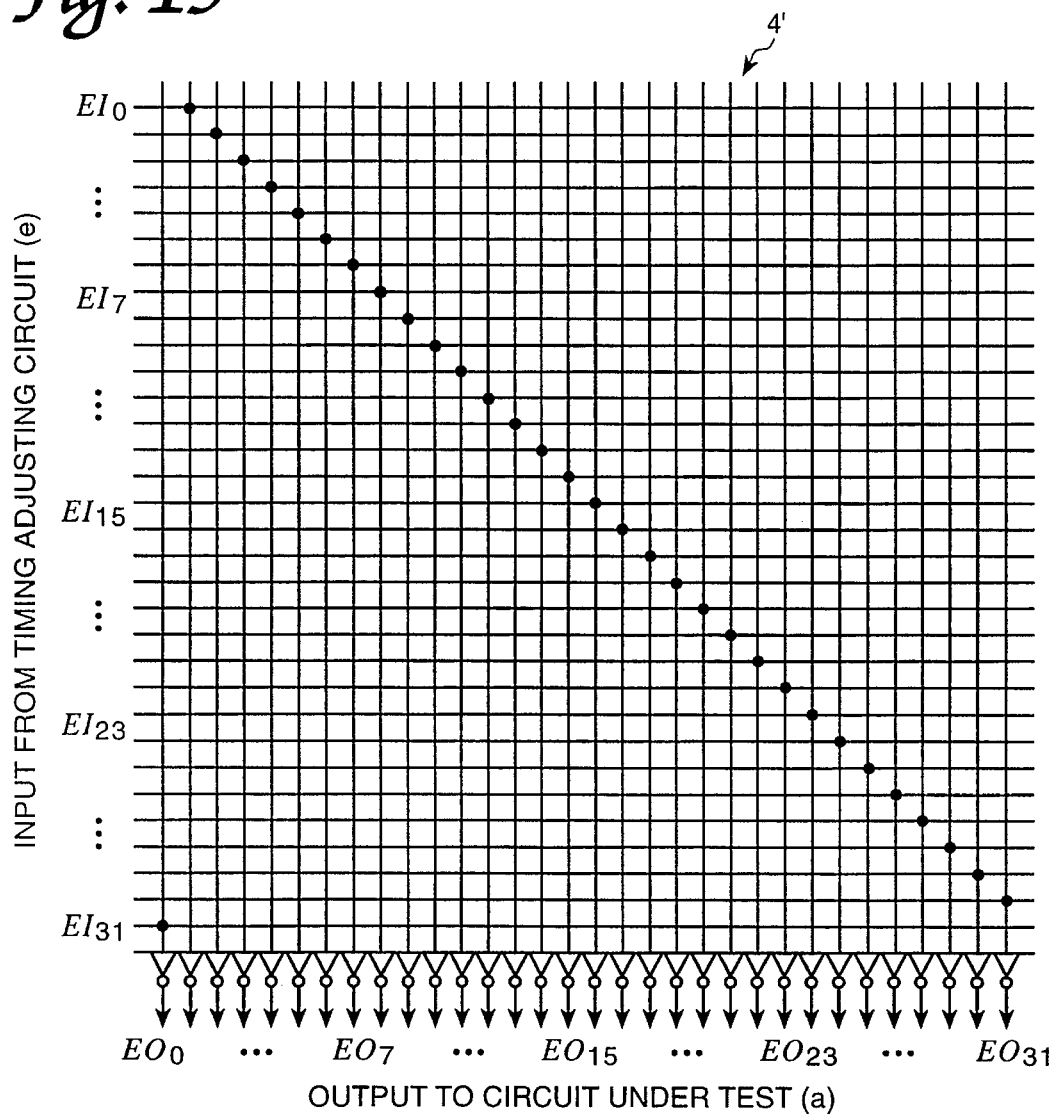
FIG. 15 is a diagram of a testing data-generating circuit of a structure different from the structure of the multiplier shown in FIG. 4.

In order that mappings used for generation of the testing data be easily given as shown in FIG. 8, the testing data-generating circuit 4 shown in FIG. 3 is constructed as shown in FIG. 15 and labelled 4'. This is a transformation of gradient −2. Therefore, the circuit configuration can be built by a simple reconnection of conductive lines and using inverter circuits. The reconnection shifts every data item upward by one bit and passes every data item through a NOT gate.

The operation for self-testing the circuit under test (FB-BIST in the illustrated example) through the use of the multiplier 200 shown in FIG. 4 and the timing adjusting circuit 3 shown in FIG. 5 is now described by referring to FIG. 3. The circuit configuration of the circuit under test is known in the stage of designing as in the prior art self-testing techniques.

As described already, it can be known by simulations what output data is obtained for the initial testing data supplied to the circuit under test. Also, it can be known in advance that how many times the feedback built-in self-test (FB-BIST) should be repeated until every step ends. In this case, it is known what initial value produces results of small correlation. Hence, the characteristics of the testing circuit can be judged. Therefore, the iteration number obtained from the simulator and the final output data become the results of the inspection when the circuit under test is normal. Data is stored in a test control memory (ROM) 12 shown in FIG. 3. In the case of the multiplier 200, initial value FFFFFFFF, number of test steps 26, and final output results 118d9e1c shown in FIG. 17 are stored in the memory 12.

The self-testing is carried out in the order described below.

(1) When a TEST signal 13 (FIG. 3) goes from low to high by external instruction, inspection begins. The testing control circuit 11 then reads out the program for an inspection, the program being stored in the test control memory 12. The inspection is initiated.

(2) The test control circuit 11 controls the following control lines to set an initial value into the testing circuit 7:

(a) SEL: When this is at high level, the timing adjusting circuit roles as a shift register. When this is at low level, the register is connected with the internal bus 2, and the flip-flop roles as a register.

(b) SCAN-IN: Data about the initial value is supplied into the timing adjusting circuit 3 in response to clock pulses (CLK) 9.

(c) CLK: Clock pulses of bits necessary to supply the data are generated.

In order to supply FFFFFFFF as the initial value to the input terminals $AI_{00}$–$AI_{15}$ and $BI_{00}$–$BI_{15}$, a value of 11111111 . . . . 1111 in binary notation is supplied from the signal line SCAN-IN into the timing adjusting circuit 3. For this purpose, the value is entered from the head of the value 1111 . . . 1111 present in the signal line SCAN-IN under the condition SEL=Hi. If clock pulses are fed to the flip-flops under the condition SEL=Hi, data items are successively entered into the flip-flops one by one from the head. This entry is repeated 32 times. Thus, one data item is entered into each of the flip-flops 350–381.

(3) When data about the initial value is set into the timing circuit 3 of the testing circuit 7, the signal line SEL is made to go low. When clock pulses CLK are applied, the testing data-generating circuit 4 is connected with the internal bus 2. The data about the initial value (in the case of the first embodiment, FFFFFFFF) is supplied from the flip-flops into the testing data-generating circuit 4 shown in FIG. 6. Immediately thereafter, the value is entered as first testing data into the multiplier 200, which is the circuit under test. Arithmetic operations are carried out. The results are produced to the internal bus 2 at the output of circuit being tested.

(4) In the second and the following steps, signal line SEL is maintained low (SEL=low) except when the initial value is entered. This permits entry of the values of the signal lines $D_{00}$–$D_{31}$. When clock pulses CLK are again applied to the testing circuit 7, the results of the previous calculation are accepted as next data into the timing adjusting circuit 3. Subsequently, data about second and third tests is generated similarly. In response to the clock pulses CLK 9, data conveyed through the signal lines $D_{00}$–$D_{31}$ are produced to the lines $E_{00}$–$E_{31}$ via the flip-flops. In this way, data about tests are automatically supplied to the circuit under test 1.

(5) After the number of the applied clock pulses CLK 9 has reached a predetermined number (the number of testing steps (26 in this example)) sufficient to detect faults in the circuit under test, the signal line SEL is made to go high. The mode of operation is so set that the value in the previous stage is sent to the flip-flop in the following stage. The final data in the timing adjusting circuit 3 is sent to the decision circuit 8 from the test result data output (SCAN-OUT) 6. Some form of data is sent from the signal line SCAN-IN to cause the final data to be sent from the flip-flops.

(6) When the testing control circuit issues an instruction (not shown) for executing a decision, data is compared with a reference value previously stored. If the data indicates normal state, the output from the decision circuit 8 is low. If the data indicates a fault, the output from the decision circuit 8 is high.

Figure 26:
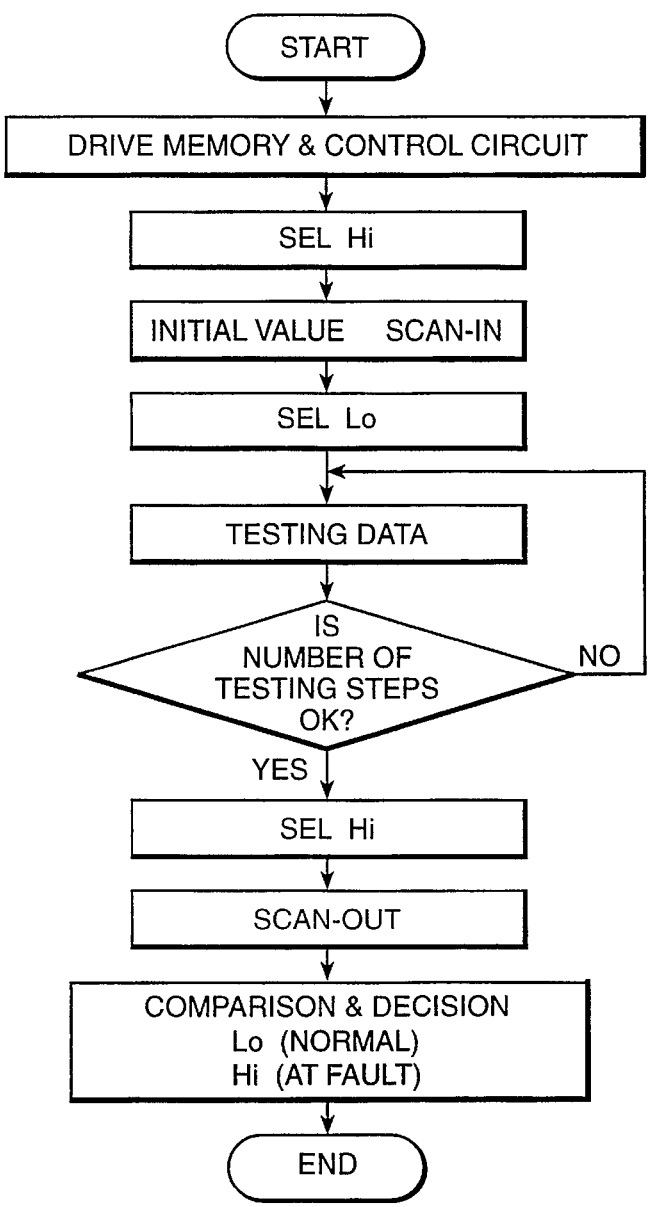
FIG. 26 is a flowchart illustrating a series of operations for self-testing.

This series of operations is illustrated in the flowchart of FIG. 26. In this sequence of testing steps, the steps for producing testing data do not rely on calculations but are directly obtained by conductive lines and inverters. In addition, the inspection is repeatedly carried out in response to clock pulses. Consequently, self-testing can be effected quickly. In the manufacturing process, the inspection time can be shortened. Where the testing circuit is fabricated monolithically, an expensive LSI tester is dispensed with. Even if an LSI tester is used, inspections can be performed rapidly by forming the testing circuit on an evaluating adapter.

A simulation was made by the testing data-generating circuit shown in FIG. 15 to know how tests are made in practice. The results are described now. Experiments were made on the multiplier 200 under the following conditions:

(1) It is assumed that every gate suffers from a power supply short, a ground short, and a line breakage. Of all 13888 faults, 5650 faults are simulated except for potential equivalent faults.

(2) The initial value $x_0$ that forms testing data and is obtained from the feedback built-in self-test (FB-BIST) is as follows:
Experiment 1: Hex 00010001
Experiment 2: Hex 00010002

(3) The prior art 16-bit self-testing initial value:
Experiment: Hex FFFF
Experiment: Hex 0001

(4) The prior art 32-bit self-testing initial value:
Experiment 5: Hex FFFFFFFF
Experiment 6: Hex 00000001

Figure 16:
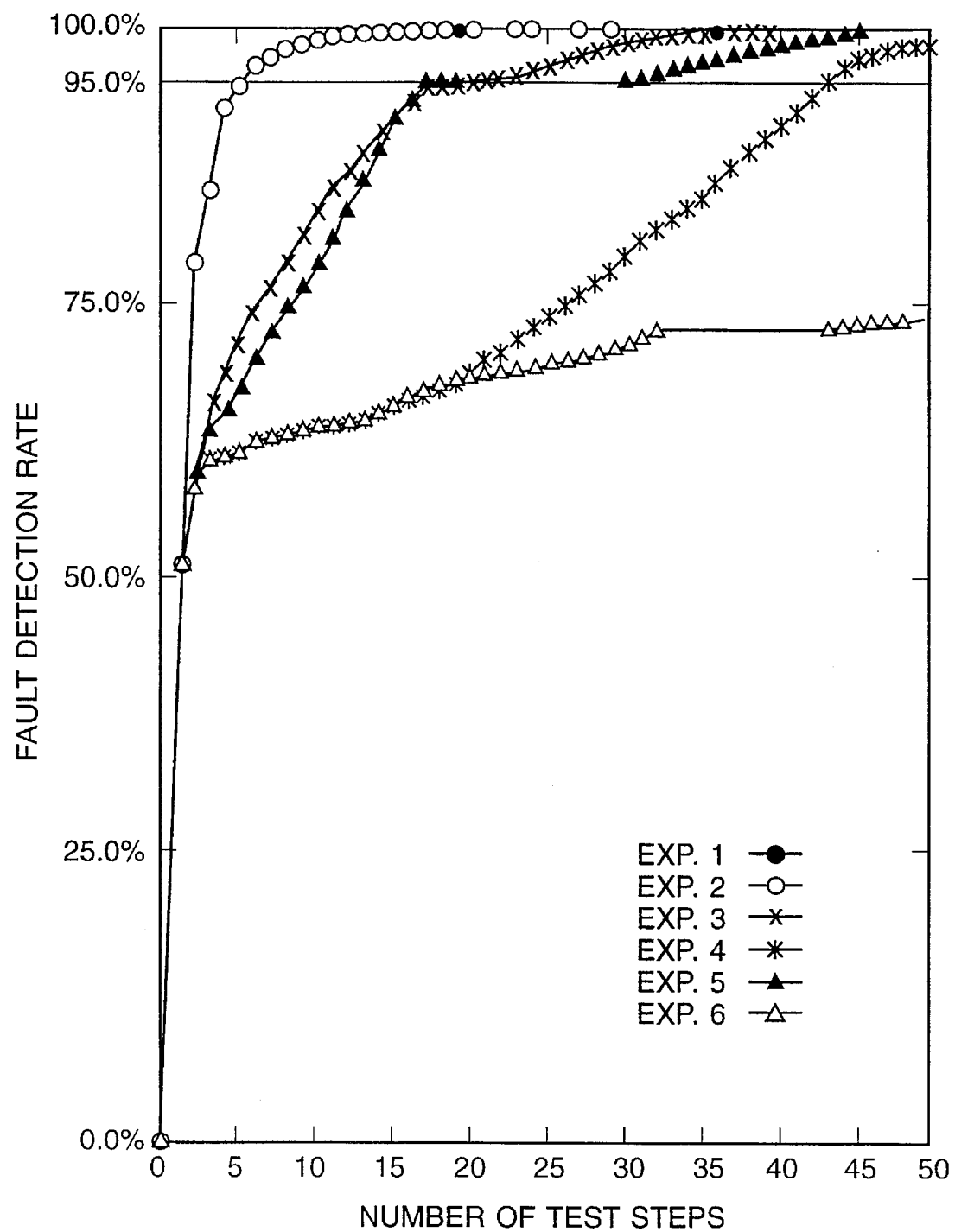
FIG. 16 is a graph showing results (or fault-detecting rate) of simulations of inspections performed by a multiplier.

The results of the experiments described above are shown in FIG. 16. The feedback built-in self-tests (FB-BISTs) (Experiments 1 and 2) in the present embodiment achieve a fault detection rate of 100% considerably earlier than the prior art techniques. In any of the Experiments 3–6, the added circuit for testing needs a 32-bit compression circuit in addition to the testing data-generating circuit. This increases the size of the hardware. On the other hand, in the novel feedback built-in self-test (FB-BIST), testing data can be created only by conductive lines and inverters. As a result, the area of the layout of the hardware structure can be reduced to about 40% compared with the prior art method.

(Second Embodiment)

Figure 18:
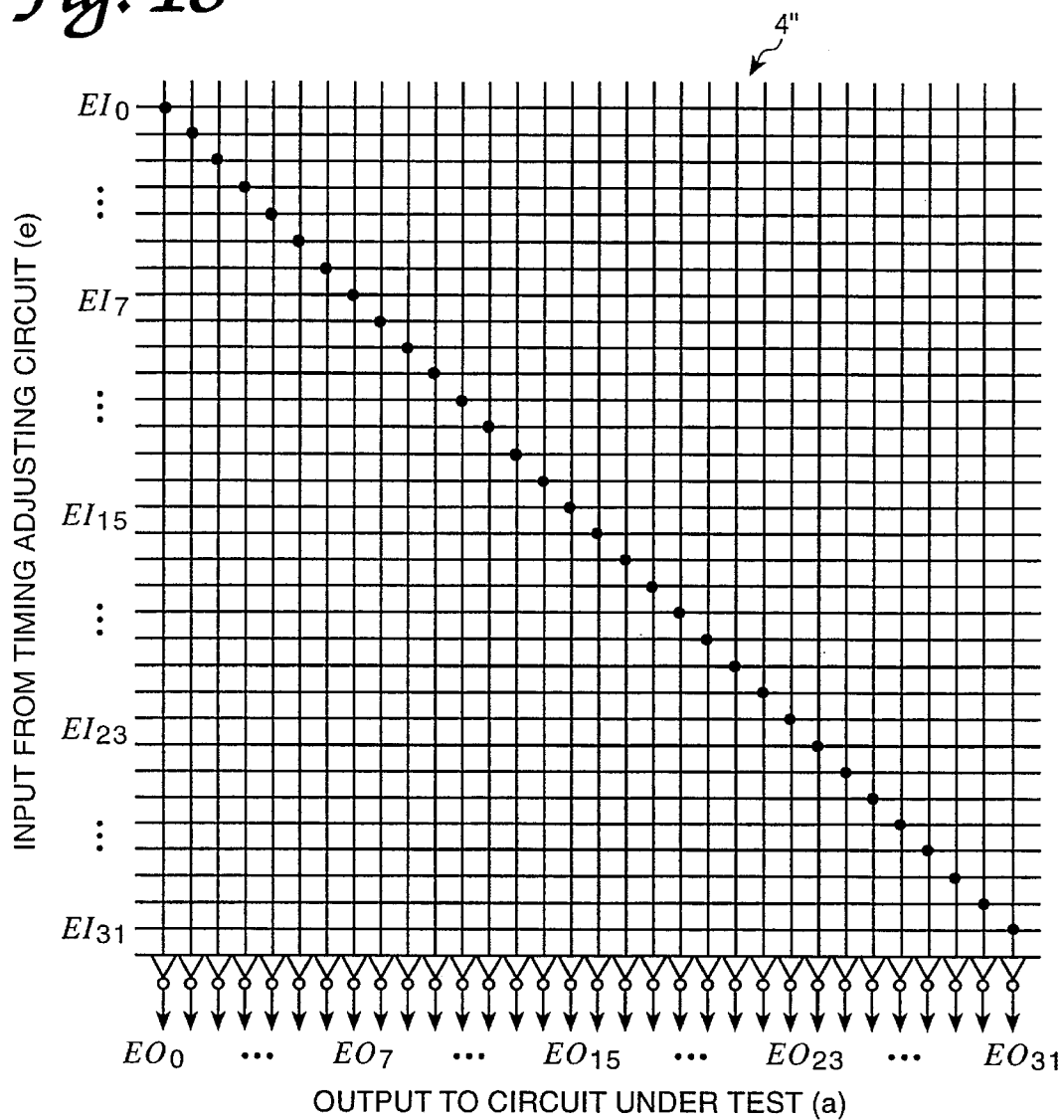
FIG. 18 is a diagram of a testing data-generating circuit according to a second embodiment of the present invention.

The testing data-generating circuit is not limited to the testing circuit shown in FIG. 6. For example, the function $$j=-2 \; i\pm 1 \qquad (10)$$

shown in FIG. 8 can maintain non-periodicity as described already in the first embodiment and so this function can be employed as a testing circuit in the multiplier 200. In this case, if data comes to intersections with line j=i, then an infinite loop is formed. Thus, the randomness is lost. Therefore, the initial value is appropriately selected. Also, this scheme is applied to a circuit under test such that randomness is maintained until this initial value is produced. During this interval, the self-testing ends. Similarly, even if the circuit under test has intersections with the line j=i, for example, the circuit works well provided that the correlation coefficient is sufficiently small within the required number of testing steps. Therefore, in some cases, the testing data-generating circuit 4" is created by reconnecting the lines shown in FIG. 18 and using inverters. The diagram illustrated in FIG. 18 means a scheme in which every bit is simply passed through a NOT gate for the following reason. Where the circuit under test is found to have sufficient degree of randomness, even if the used testing circuit has a linear relation, or gradient of −1, the role of the testing circuit and the role of the circuit under test shown in FIG. 13(b) are only interchanged. Therefore, the correlation of the obtained data about testing is similarly sufficiently small. The gradient of −1 means that only a NOT gate is provided for every bit. Therefore, this structure can be easily constructed. However, this can be applied to not all circuits under test and so, if necessary, some bits may be operated so as to create disturbances. In any case, if the found correlation is sufficiently small, the invention can be applied to the circuit under test. We have checked the correlation coefficients about the multiplier 200 and have found that the testing circuit structure shown in FIG. 18 can sufficiently cope with the multiplier 200.

(Third Embodiment)

Figure 19:
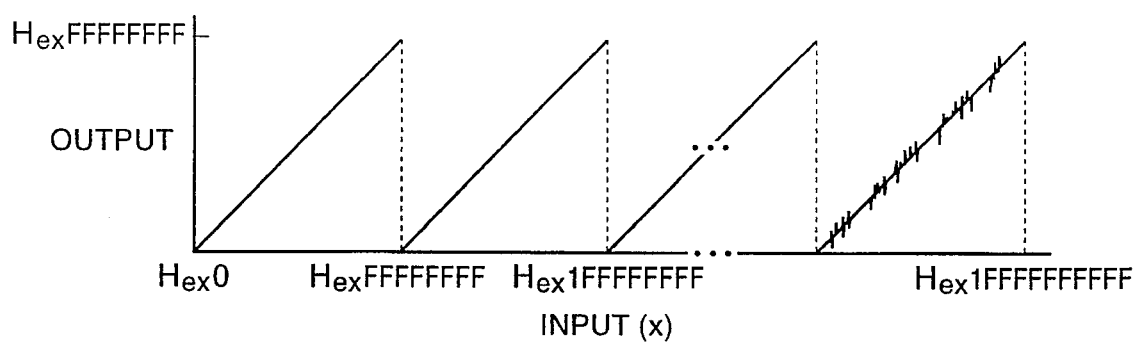
FIG. 19 is a graph showing the input-output characteristics of C1355 circuit.

C1355 logic circuit (C1355 benchmark circuit) is a benchmark circuit proposed in IEEE ISCAS '85. This circuit is a combinatorial logic circuit whose total number of gates is 512. The number of inputs is 41 bits. The number of outputs is 32 bits (F. Brgez and H. Fujiwara: A NEUTRAL NETLIST OF 10 Proc. 1985 IEEE Int. Symp. Circuits and Systems, Kyoto, Jun. 5–7 (1985)). In this circuit, the input-output bits are appropriately ordered up to Hex 0 through Hex 1FFFFFFFFFFFFFFFFFF so that the input-output relations illustrated in FIG. 19 are obtained.

Figure 20:
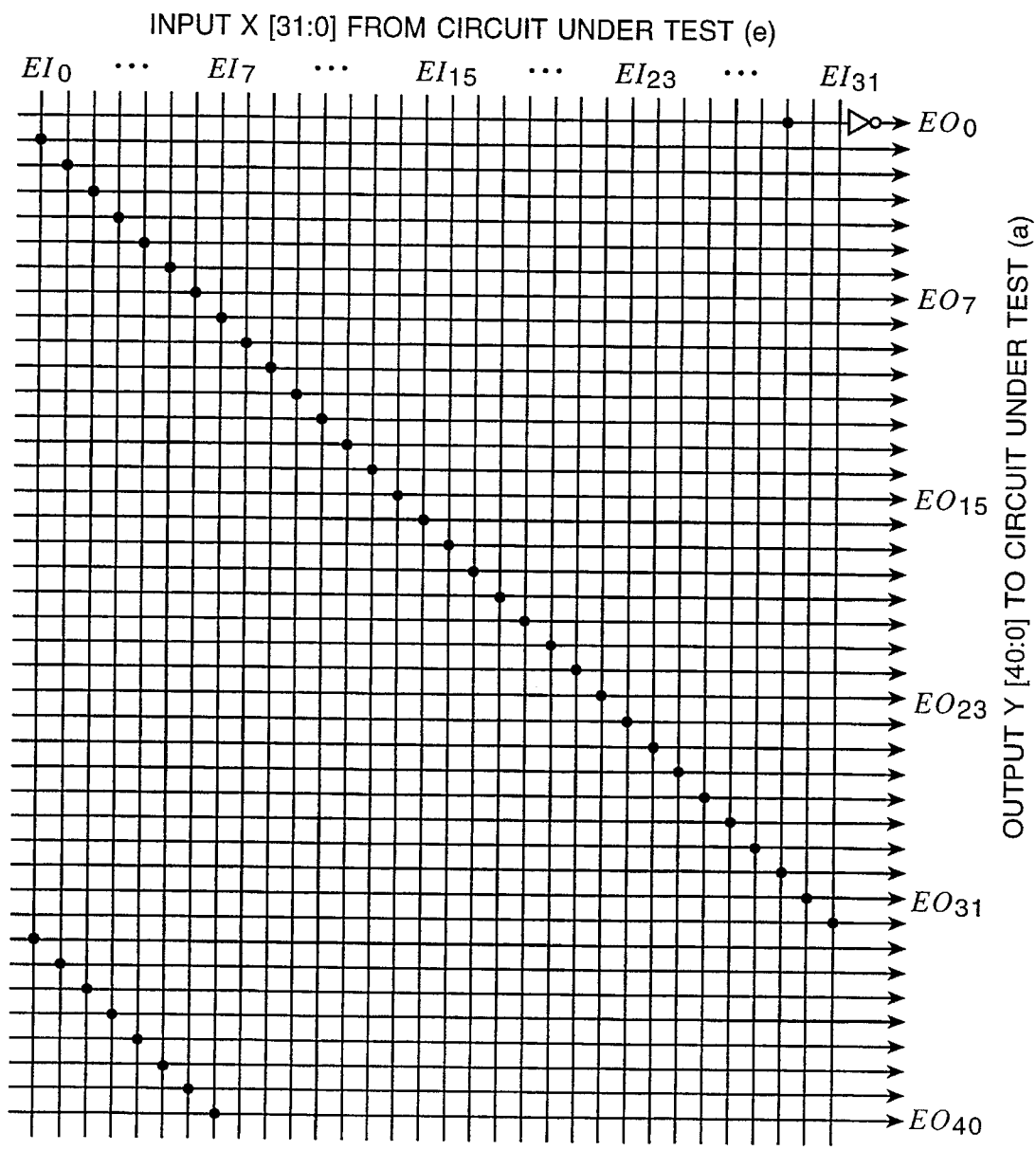
FIG. 20 is a diagram of a testing data-generating circuit used with the C1355 circuit when the number of the output lines is larger than the number of input lines.

Utilizing this characteristic, the testing data-generating circuit is constructed so that the relation of the output y [31:1] to the input x [31:0] is y=2x, as shown in FIG. 20. Output side lowest bit y[0] is connected as a disturbance via both x [29] and an inverter. Output y [40:32] is connected with lower-order bit x [7:0] of the input to produce random variations. Simulations of tests using this structure were made. The results are described below. Experiments were carried out under the following conditions:

(1) It is assumed that every gate suffers from a power supply short and a ground short. Of all 1174 faults, 846 faults are simulated except for potential equivalent faults.

(2) The initial value $x_0$ that forms testing data and is obtained from the novel feedback built-in self-test (FB-BIST) is as follows:
Experiment 1: Hex 1FFFFFFFFFFFFFFFF1
Experiment 2: Hex 0000000000000000001

(3) The prior art 32-bit self-testing initial value:
Experiment 3: Hex 1FFFFFFFFFFFFFFFF1
Experiment 4: Hex 0000000000000000001

Figure 21:
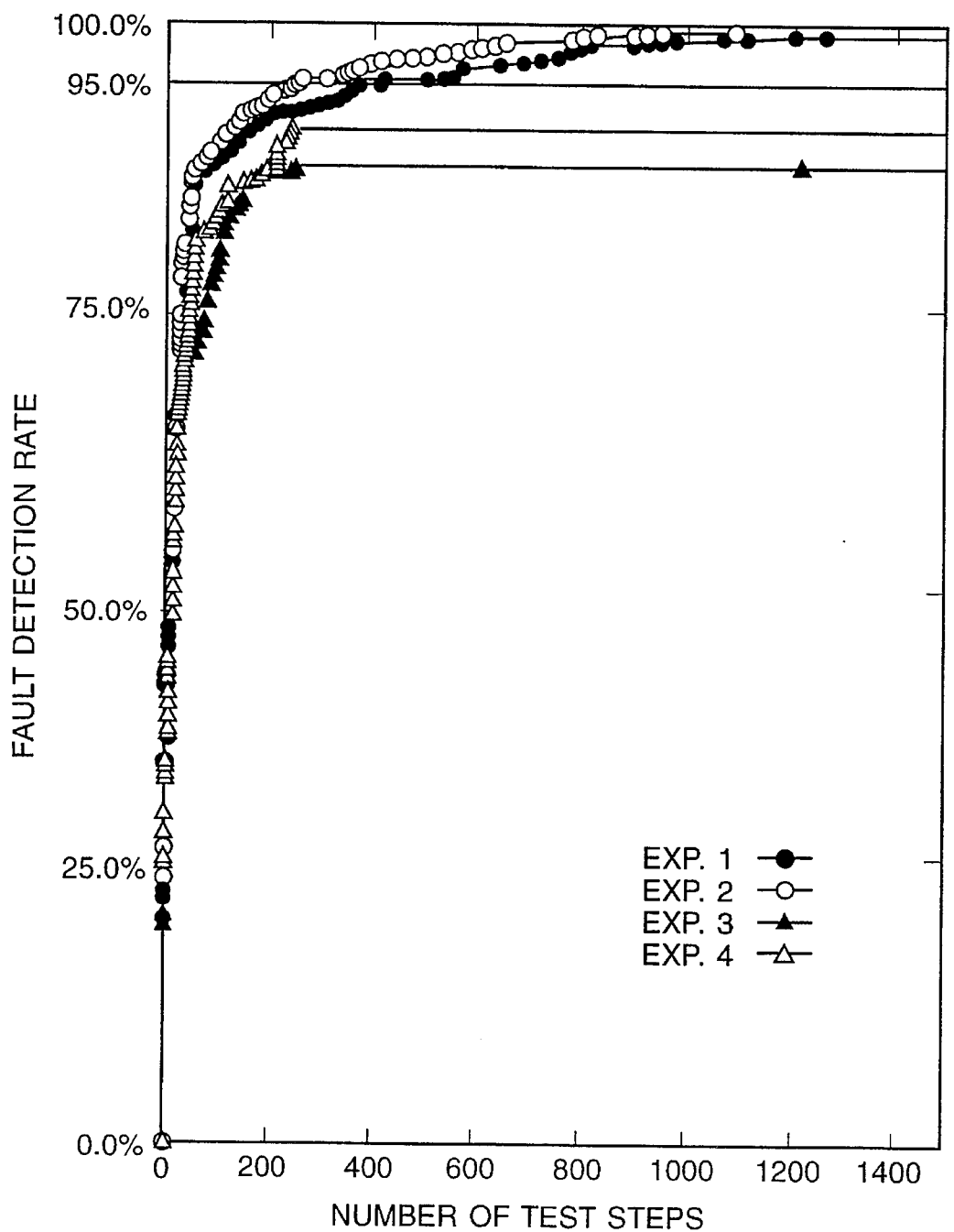
FIG. 21 is a graph showing the results of simulations of the inspections of C1355 circuit, or fault detection rate.

The results of the experiments are shown in FIG. 21. It can be seen from the results that where tests were made with the novel FB-BIST, 95% of faults was detected with 400 feedbacks. In the prior art method, even after 1400 testing steps are performed, a fault detection rate of 95% is not reached. In practice, about 20 thousand experiments were conducted but a fault detection rate of 95% could not obtained.

(Fourth Embodiment)

Figure 22:
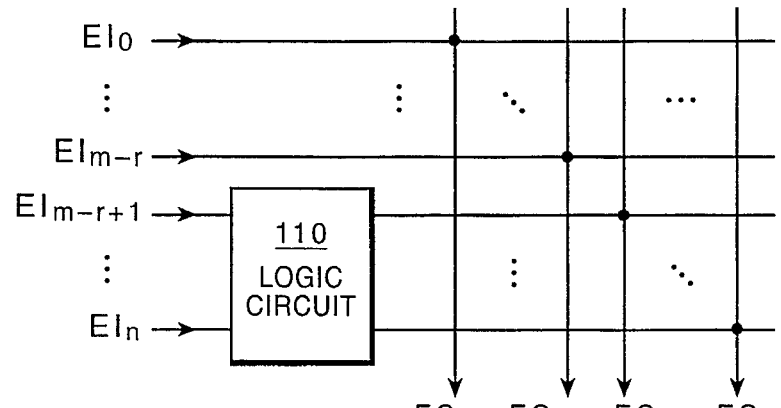
FIG. 22 is a diagram of a testing data-generating circuit, of a fourth embodiment of the invention, used when the number of the input lines is larger than the number of output lines.

In the third embodiment, the input bit number is fewer than the output bit number. The invention can also be similarly applied to a structure where the input bit number is more than the output bit number. However, if the result of a test conducted at any stage indicates a circuit fault and a different data item is produced, the result must be reflected in the input bits. For this reason, a simple structure in which the input bits are merely thinned out so as to agree in number with the output bits cannot be adopted. Accordingly, as shown in FIG. 22, an appropriate logic circuit 110 just like a decoder is provided for some or all of input bits to produce outputs conforming to the number of output bits. In the structure of FIG. 22, after passing through the logic circuit 110, LSB lines are simply connected together. Obviously, connections providing a small correlation coefficient may also be selected.

(Fifth Embodiment)

Figure 23:
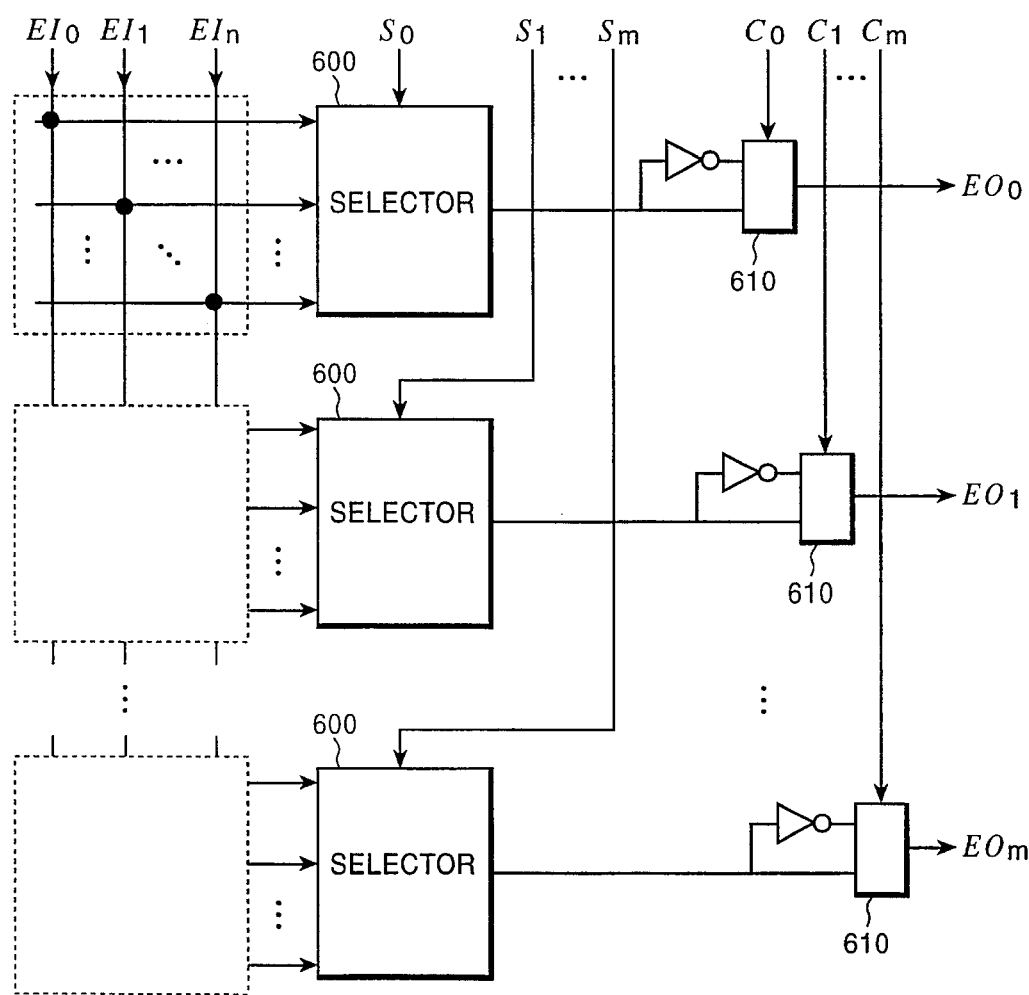
FIG. 23 is a diagram of a testing data-generating circuit forming a fifth embodiment of the invention.
Figure 24:
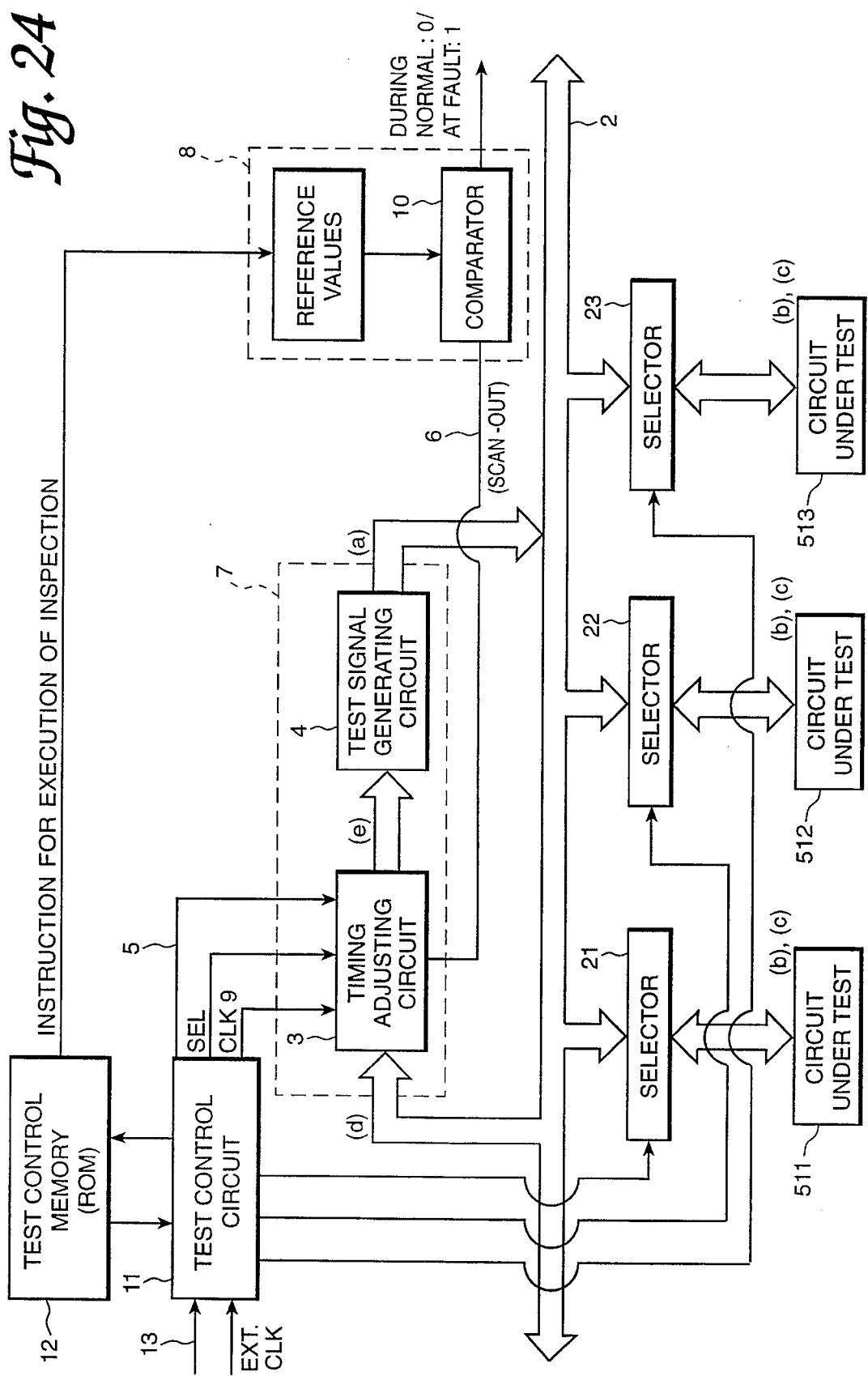
FIG. 24 is a block diagram of a semiconductor device to which the testing data-generating circuit shown in FIG. 23 is applied.

Referring to FIG. 23, selectors 600 and 610 having a required number of bits are provided for output bits to give flexibility to the output bits. Thus, the structure is of the general-purpose type and can be applied to any kind of semiconductor integrated circuit, and a semiconductor device as shown in FIG. 24 can be built. If the configuration shown in FIG. 23 is used as it is, the number of elements is increased, and the area occupied by the chip is increased. Therefore, it is not necessary to provide selectors for all bits. It suffices to provide selectors for the circuits under test of functional units contained in a semiconductor device of interest such that their correlation coefficients are small. In this case, the number of the selectors can be reduced to a minimum. Therefore, a circuit for inspecting a large-scale integrated circuit can be fabricated by adding only a small number of selector circuits. In some cases, circuits having small correlation coefficients can be built into all semiconductor devices of interest only by reconnecting lines and using inverters as shown in FIGS. 6, 15, 18, and 20. This yields greater advantages.

Figure 25:
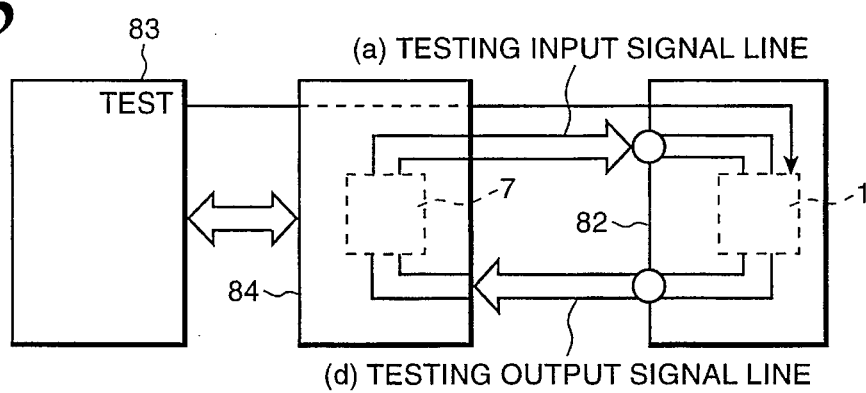
FIG. 25 is a block diagram of a sixth embodiment of the invention.

(Sixth Embodiment)

Where this testing circuit is not incorporated within a semiconductor device but mounted externally, similar advantages can be obtained. More specifically, for the conventional LSI tester, a probe, or an evaluating board, having detecting terminals is mounted for an inspected semiconductor device. A testing data pattern is entered from the outside. The results are extracted also from the probe. An external device judges the results of the inspection. As shown in FIG. 25, the novel testing circuit is installed on the evaluating board 84 or on an adapter (not shown) positioned in an intermediate position on the probe. The circuit under test 1 on LSI 82 is inspected, using the testing circuit 7. The inspection can be carried out without the need to supply a test pattern from the outside. In this case, it is not necessary to incorporate a testing circuit within a semiconductor device. Only a circuit which provides synchronization with the output is necessary, and the purpose is fully accomplished.

The "onto mapping" referred to herein is a terminology used in the mathematical set theory, and represents such a relation (or function) between input x and output y that any value of y can be expressed in terms of any value of x. In this case, plural values of x may correspond to one value of y.

The chaotic system referred to herein does not always mean mathematical chaos theory or a chaotic state. In particular, complete chaos assures complete randomness but it is difficult to realize a circuit which reflects complete chaos. In actual use, it is common practice to use an approximate circuit which can be readily realized. In semiconductor devices, information is digitized, and the range in which data is used is restricted. Therefore, if all data is consumed or treated, the original data appears. Hence, it can be said that complete chaotic state cannot exist. Therefore, "pseudo-random" means a similar relation.

(Seventh Embodiment)

Figure 27:
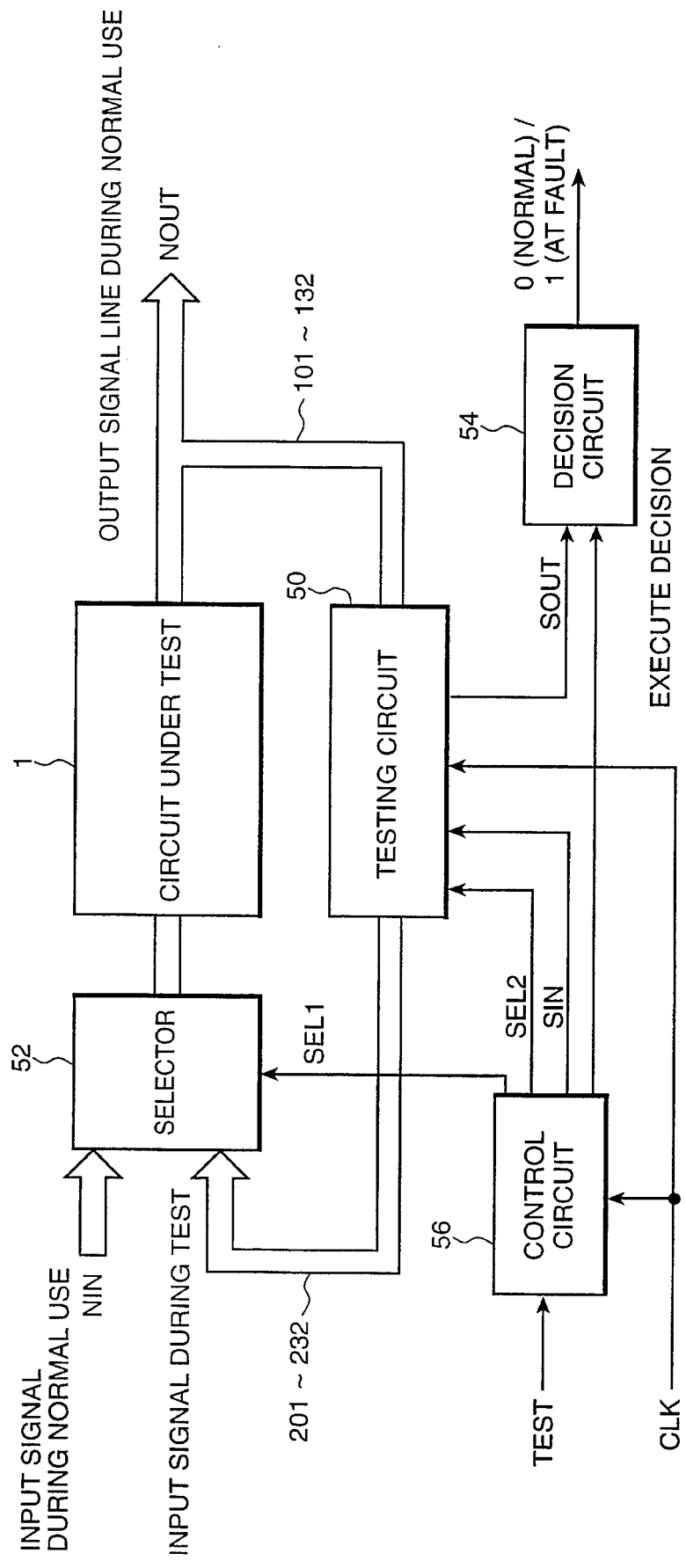
FIG. 27 is a block diagram of a seventh embodiment of the invention.

A seventh embodiment of the present invention is hereinafter described with reference to the accompanying drawings. FIG. 27 shows the configuration of a self-testing LSI that treats digital signals. This self-testing LSI comprises a logic circuit such as a circuit under test 1 intrinsically incorporated in the LSI (e.g. a multiplier or a ROM), a testing circuit 50, a selector 52, a decision circuit 54, and a control circuit 56 for controlling the testing circuit 50, the selector 52, and the decision circuit 54 during inspection. The testing circuit 50 accepts output data from the circuit under test 1 and produces testing data to the circuit under test 1. The selector 52 is a selecting means for selecting an input signal produced during normal use and an input signal during inspection. The selector 52 acts also as a selector circuit. The decision circuit 54 is a test result decision means including a comparator circuit for judging results of inspection produced from the testing circuit 50 during inspection.

Figure 28:
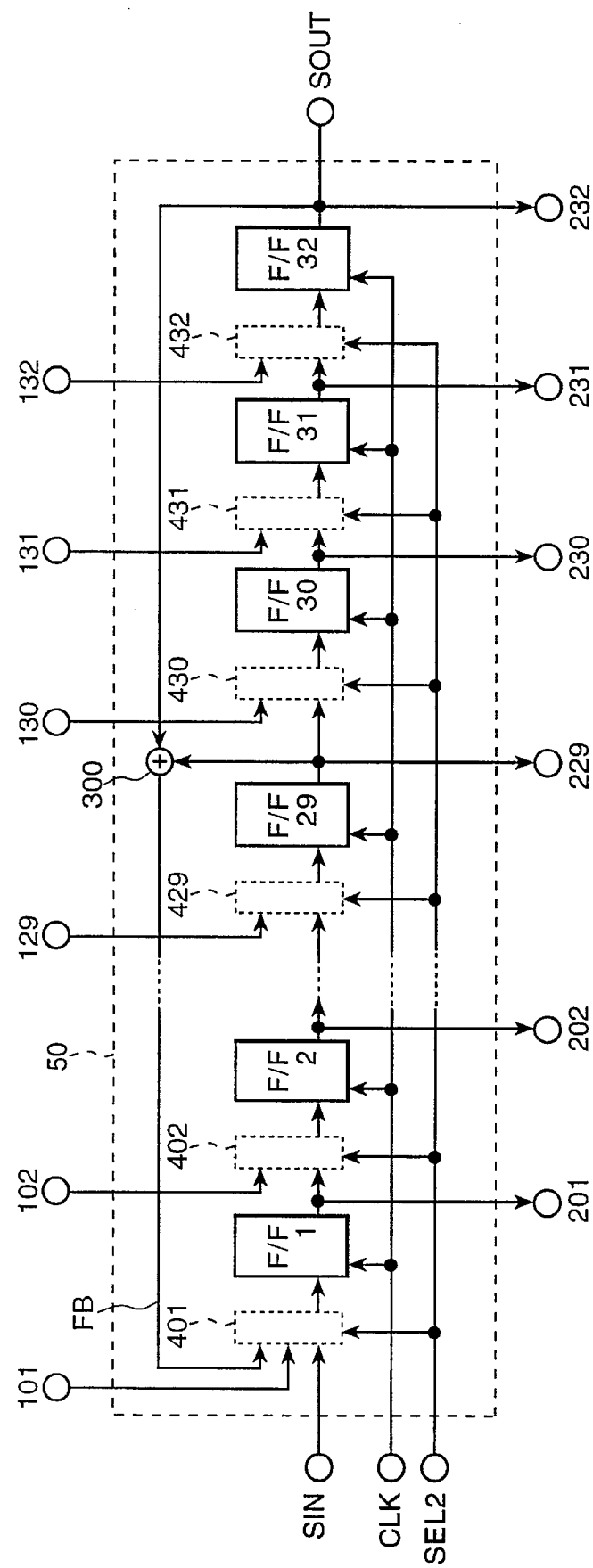
FIG. 28 is a diagram of a testing circuit.

FIG. 28 shows one example of configuration of the testing circuit 50 shown in FIG. 27. In this testing circuit 50, signal lines 102–132 are connected with the output signal line of the circuit under test 1. Signal lines 201–232 are connected to the input of the selector 52. The signal lines 101–132 are connected with one of the inputs of testing data-generating circuits 401–432 which are testing data-generating means. The testing data-generating circuits 401–432 are connected to their respective following stages of flip-flops. The output of the first stage of flip-flop (F/F1) is connected to the input signal line 201 and also to the other input of the testing data-generating circuit 402. The second to thirty-first stages of flip-flops F/F2–F/F31 are connected similarly.

Some of the flip-flops F/F1–F/F32 are connected with the testing data-generating circuit 401 via an exclusive-OR gate of the logic circuit. In FIG. 28, the input signal lines 229 and 232, which are outputs from the flip-flops F/F29 and F/F32, respectively, are connected back to the testing data-generating circuit 401 via an exclusive-OR gate 300 so that the flip-flops F/F1–F/F32 forming a linear feedback register (LFSR) forms a primitive polynomial. Of course, other flip-flops may be connected back to the testing data-generating circuit so that testing data necessary to inspect the circuit under test 1 may be obtained.

To form a primitive polynomial means that the linear feedback register (LFSR) consisting of a series combination of the flip-flops as shown in FIG. 28 is constructed so that the data appearing on the output 201–232 have $2^{32}-1$ patterns. This has been mathematically proved. Conversely, if such a circuit configuration is built, the output from this circuit expresses a primitive polynomial. That "other flip-flops may be connected" means that if the required number of tests can be fewer than the number of data patterns expressed by a primitive polynomial, the testing circuit 50 is not always required to realize the primitive polynomial. In this case, the number of stages of flip-flops may be varied.

In one mode of operation, the flip-flops F/F1–F/F32 shown in FIG. 28 form a 32-bit shift register activated by external clock pulses CLK through signal line SEL2. This shift register acts as an initial value entry means for entering desired 32-bit data consisting of 0s and 1s as a first set of testing data serially into the testing circuit 50. In another mode of operation, these flip-flops act as a linear feedback register (LFSR) for generating new testing data in response to signals on the signal lines 101–132 from the circuit under test 1. The flip-flops F/F1–F/F32 are switched between these modes of operation.

Figure 29A:
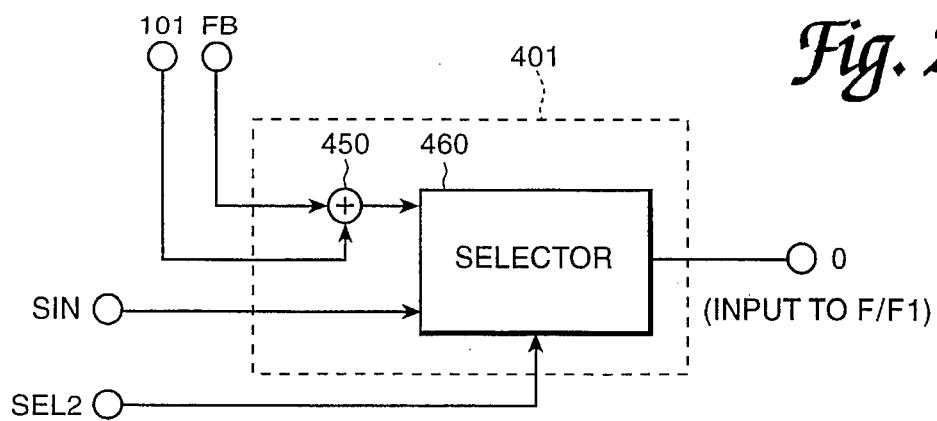
FIGS. 29(a) and 29(b) are diagrams illustrating one example of the testing data-generating means included in the testing circuit shown in FIG. 28.
Figure 29B:
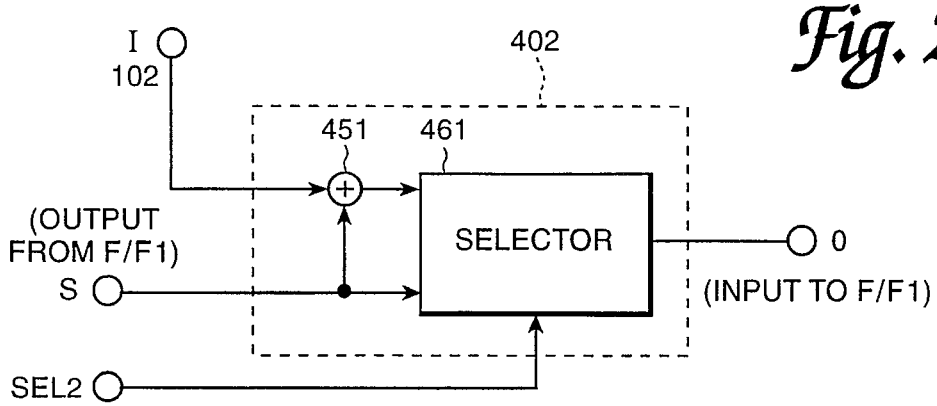

One example of the testing data-generating circuit shown in FIG. 28 is shown in FIGS. 29(a) and 29(b) as testing data-generating means. In FIG. 29(a), the testing data-generating circuit 401 has a selector 460. The signal line 101 and a signal line FB are connected with one input of the selector 460 via an exclusive-OR gate 450. A value determined by the states in the signals lines 101 and FB is applied to the selector. Another signal line SIN is connected to the other input of the selector 460. The selector 460 selects one of these inputs according to the state of the signal on the signal line SEL2 and produces an output signal to the input (O in FIG. 29(a)) of the flip-flop F/F1.

In the testing data-generating circuit 402 (FIG. 29(b)) corresponding to the second stage of flip-flop F/F2 (FIG. 28), the signal line 102 (I in FIG. 29(b)) is connected with one input of an exclusive-OR gate 451. The other input of the exclusive-OR gate 451 is connected with the output (S in FIG. 29(b)) of the flip-flop F/F1. The output of this exclusive-OR gate 451 is connected with one input of a selector 461, while the other input of the selector 461 is connected with the output S of the previous stage of flip-flop F/F1. The selector 461 selects one of these inputs through the signal line SEL2 and produces an output signal to the input (O in FIG. 29(b)) of the flip-flop F/F2.

Figure 30:
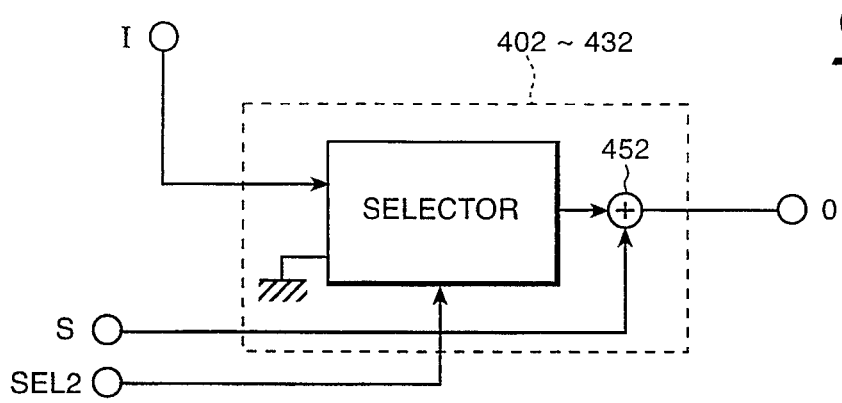
FIG. 30 is a diagram of another example of the testing data-generating means included in the testing circuit shown in FIG. 28.

Testing data-generating circuits 403–432 are connected similarly to the testing data-generating circuit 402. The testing data-generating circuits 402–432 may also be constructed as shown in FIG. 30. That is, an exclusive-0R gate 452 is placed after the selector 461.

A series of testing operations performed by the self-testing circuit constructed as described above is now described from the start of this series of operations. A TEST signal shown in FIG. 27 places the circuit under test 1 in test mode. The control circuit 56 sends a signal to the selector 52 through a line SEL1 to cause the selector 52 to switch the connected line from input signal line NIN used during normal use to input signal lines 201–232 used during inspection.

Then, the control circuit 56 sends another signal through the line SEL2 to connect the testing data-generating circuit 401 shown in FIG. 28 to a line SIN and the other testing data-generating circuits 402–432 to the signal line SIN (S is the input as shown in FIG. 29(b)). Under this condition, the flip-flops F/F1–F/F32 shown in FIG. 28 operate as a 32-bit shift register. Then, the control circuit 56 supplies 32 bit-data consisting of 0s and 1s serially into the flip-flops F/F1–F/F32 through the line SIN in response to the clock pulses CLK, whereby data is established. This data consisting of 0s and 1s forms a first set of data in the series of operations for inspecting the circuit under test 1. Since the structure of the circuit under test 1 is already known, this binary data consisting of 0s and 1s can be previously set so that assumed faults in the circuit under test 1 are found. Therefore, the data can be previously held in the control circuit 56.

After the first set of testing data is entered into the flip-flops F/F1–F/F32 through the signal line SIN and established, the input of the testing data-generating circuit 401 is switched to the side of signal lines 101 and FB. The inputs of the other testing data-generating circuits 402–432 are switched to the signal lines 102–132 (on the side of I in FIG. 29(b)). That is, it follows that the first stage of flip-flop F/F1 is disconnected from the signal line SIN. Thereafter, the testing circuit 50 is kept disconnected from the control circuit 56 until a series of inspecting operation is finished. In this way, the flip-flops F/F1–F/F32 act as a linear feedback shift register. The circuit under test 1 is connected with the testing circuit 50, and inspections are done.

Under this condition, the first test is initiated.

(1) When clock pulses CLK are applied to the flip-flops F/F1–F/F32, the first set of testing data established and held in the flip-flops F/F1–F/F32 is supplied in parallel into the circuit under test 1 via the signal lines 201–232. In response to the testing data, the circuit under test 1 produces results of the first test, or output data. This output data is supplied in parallel into the testing circuit 2 through the signal lines 101–132. The operation carried out as described thus far is referred to as the first test.

(2) Subsequently, the second test is started. When clock pulses CLK are applied to the flip-flops F/F1–F/F32, the results of the first test applied via the signal lines 101–132 and a second set of testing data are supplied in parallel into the circuit under test 1 through the signal lines 201–232. The second set of testing data is newly generated in the testing data-generating circuits 401–432. In response to the testing data, the circuit under test 1 produces results of the second test, or output data. This output data is supplied in parallel into the testing circuit 50 through the signal lines 101–132. The operation carried out as described thus far is referred to as the second test.

(3) Subsequently, third and fourth tests are carried out automatically only by supplying the clock pulses CLK.

The process described thus far is repeatedly carried out until the number of repetitions reach a value n that is sufficient to inspect every fault inside the inspected circuit 1. Since the structure of the circuit under test 1 is already known, the final number of steps n, the values of the first set of testing data introduced into the flip-flops F/F1–F/F32, and expected values used when the circuit under test 1 is normal can be calculated in advance, by taking account of detection of faults in the circuit under test 1.

After the end of the n-th test, the control circuit 56 produces a signal through the line SEL2 to switch the input of the testing data-generating circuit 401 to SIN and the inputs of the testing data-generating circuits 402–432 to the signal line SIN (plus S in FIG. 29(b)). In this way, the flip-flops F/F1–F/F32 operate again as a 32-bit shift register. The final output data from the circuit under test 1 is held in these flip-flops F/F1–F/F32. In response to the clock pulses CLK, the binary data consisting of 0s and 1s held in the flip-flops F/F1–F/F32 is sent in parallel to the decision circuit 54 through output SOUT. This binary data is referred to as results of the final test.

The results of the final test maintain the information indicating whether the circuit under test 1 is normal or at fault. That is, if the circuit under test 1 is normal, the results of the final test are data exactly agreeing with the previously found expected value. If a fault is present inside the circuit under test 1, then the results of the final test are some kind of data different from the expected value. A decision execution signal from the control circuit 56 causes the decision circuit 54 to compare the previously held, expected value with the output sent via the output SOUT. If they agree, 0 indicating that the circuit is normal is delivered. If they disagree, 1 indicating that the circuit is at fault is delivered. Then, the inspection of the circuit under test 1 is ended.

The circuit under test 1 can have a register therein, in which case external clock pulses CLK may be entered into the circuit under test 1 to operate the register and to carry out tests. In the testing circuit 50, the signal lines 101–132 are equal in number with the signal lines 201–232. This structure can also be used where these two kinds of signal lines are different in number. For example, in the structure shown in FIG. 28, if the signal lines are from 101 to 131, then the signal line 132 may be omitted. Also, an exclusive-OR gate 332 with which the signal line 132 is connected may be omitted.

Similarly, if the signal lines are from 201 to 231, the signal line 232 may be omitted, and only that portion which connects the output of the flip-flop F/F32 with the exclusive-OR gate 300 may be left behind. Furthermore, it can be considered that the number of the input signal lines and the number of the output signal lines in the circuit under test 1 may assume various values. The number of the flip-flops forming the testing circuit 50 may be varied variously according to the number of these signal lines. In any case, the requirement is that enough testing data items which are sufficient to inspect the circuit under test 1 be delivered.

In the structure shown in FIG. 27, the results of the final test are delivered through the output SOUT. Similar advantages can be had by directly introducing the values in the signal lines 101–132 at the end of inspection in parallel into the decision circuit 4.

(Eighth Embodiment)

In the seventh embodiment, testing data is accepted serially through SIN to enter the first set of testing data into the testing circuit 50 and to establish the data. The present invention can also be applied to a structure using an initial value entry means having flip-flops equipped with set or reset terminals. The structure of the testing circuit 50 of this structure is shown in FIG. 31.

Figure 31:
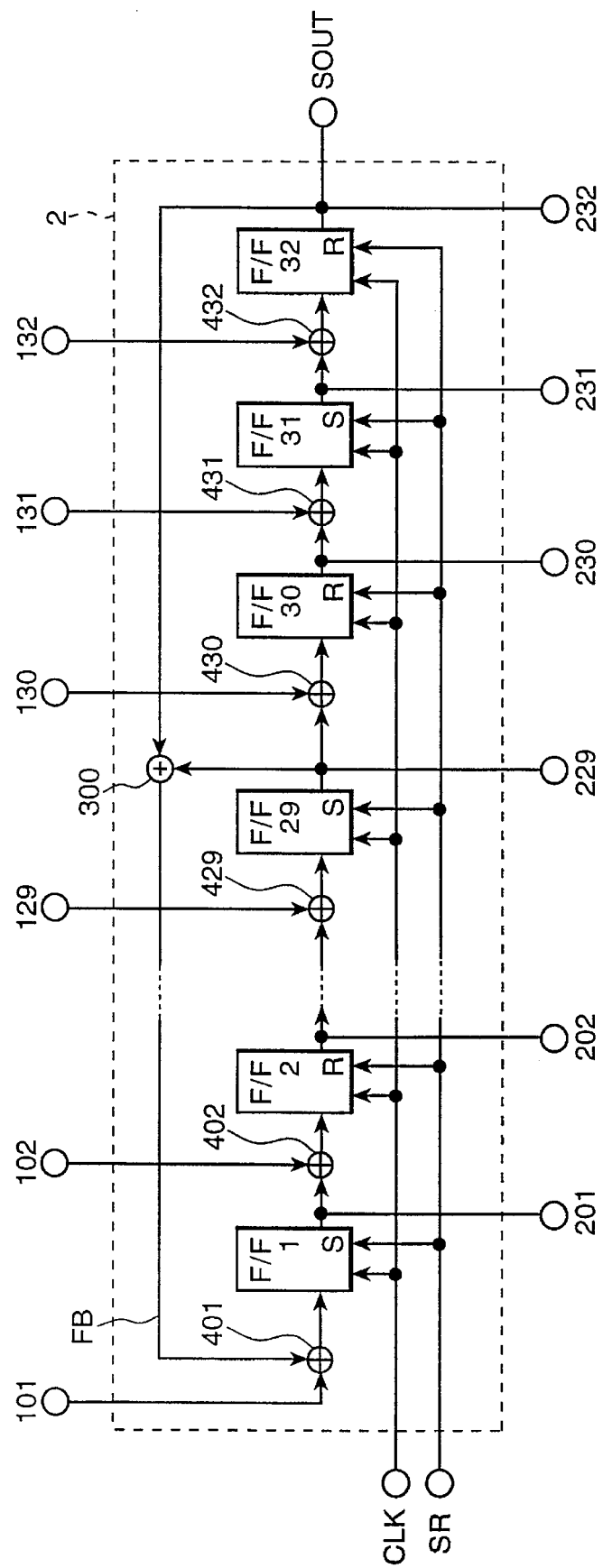
FIG. 31 is a diagram of an eighth embodiment of the invention.

In the eighth embodiment shown in FIG. 31, flip-flops F/F1–F/F32 forming components of the testing circuit 2 have setting or resetting terminals. An SR signal from the control circuit 56 sets or resets each flip-flop. During an inspection, the SR signal from the control circuit 56 directly sets the first set of testing data into each flip-flop. Each flip-flop has preselected setting and resetting terminals in the form of a piece of hardware, because preset data is determined in the same way as in the seventh embodiment. In this case, the first set of testing data cannot be altered during inspection. However, the structure of the initial value entry means is made simpler. Furthermore, the selectors in the testing data-generating circuits shown in FIGS. 28, 29(a), and 29(b) are dispensed with. Hence, the circuit is simplified.

(Ninth Embodiment)

Figure 32:
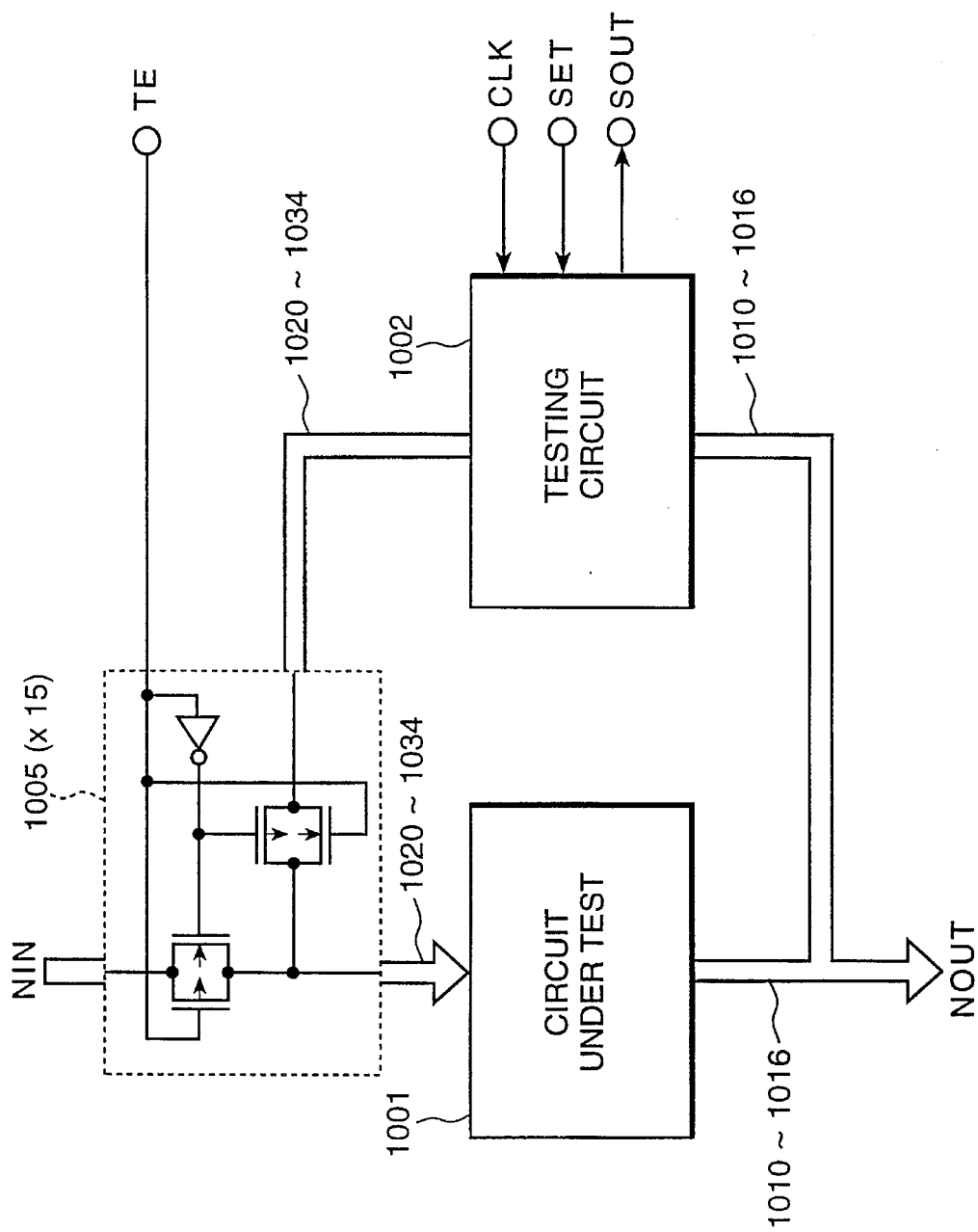
FIG. 32 is a diagram of a ninth embodiment of the invention.
Figure 33:
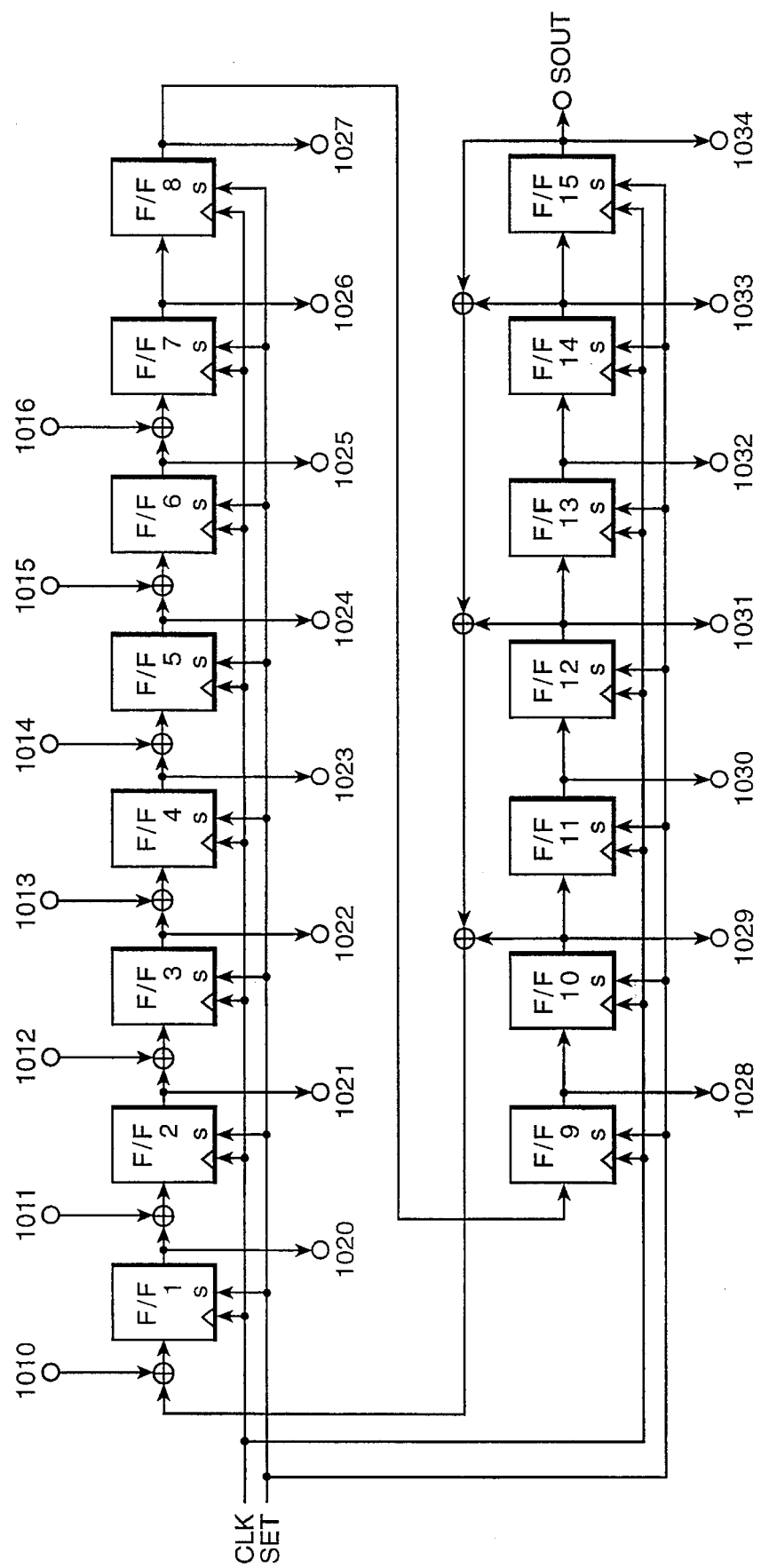
FIG. 33 is a diagram of one example of the testing circuit shown in FIG. 32.
Figure 34:
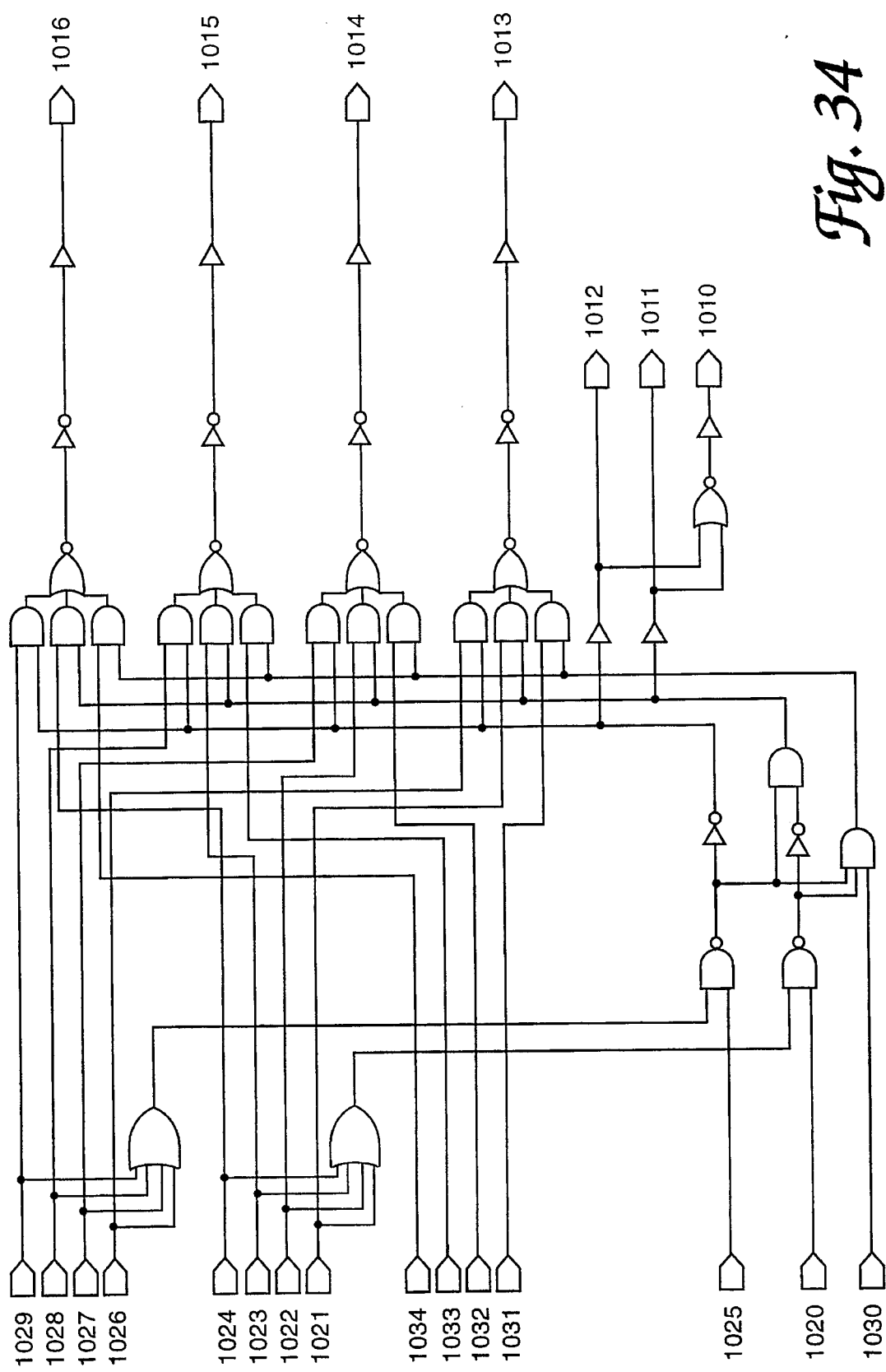
FIG. 34 is a diagram of one example of the inspected circuit shown in FIG. 32.

The ninth embodiment is a self-testing circuit 1000, which is a specific example of the eighth embodiment. As shown in FIG. 32, this self-testing circuit comprises an circuit under test 1001 and a testing circuit 1002. It is assumed that the testing circuit 1002 inspects the circuit under test 1001 shown in FIG. 34 through the linear feedback register (LFSR) shown in FIG. 33. The circuit under test 1001 is an arithmetic logic unit made up of AND circuits and OR circuits. The circuit under test 1001 has a 15-bit input and a 7-bit output. The testing circuit 1002 shown in FIG. 33 comprises 15 flip-flops equipped with setting terminals. Output signal lines 1010–1016 from the circuit under test 1001 are connected into the input front stages of flip-flops F/F1–F/F7, respectively. Exclusive-OR gates are connected between the output signal lines 1010–1016 and the front stages of the flip-flops F/F1–F/F7, respectively. Exclusive-OR gates are connected between the feedback line from the flip-flop F/F15 and the outputs from the flip-flops F/F10, F/F12, and F/F14. The feedback line from the flip-flop F/F15 is connected with the flip-flop F/F1. In this case, the primitive polynomial is $x^{14}+x^5+x^3+x+1$. The circuit under test 1 is inspected in the manner described now.

Figure 35:
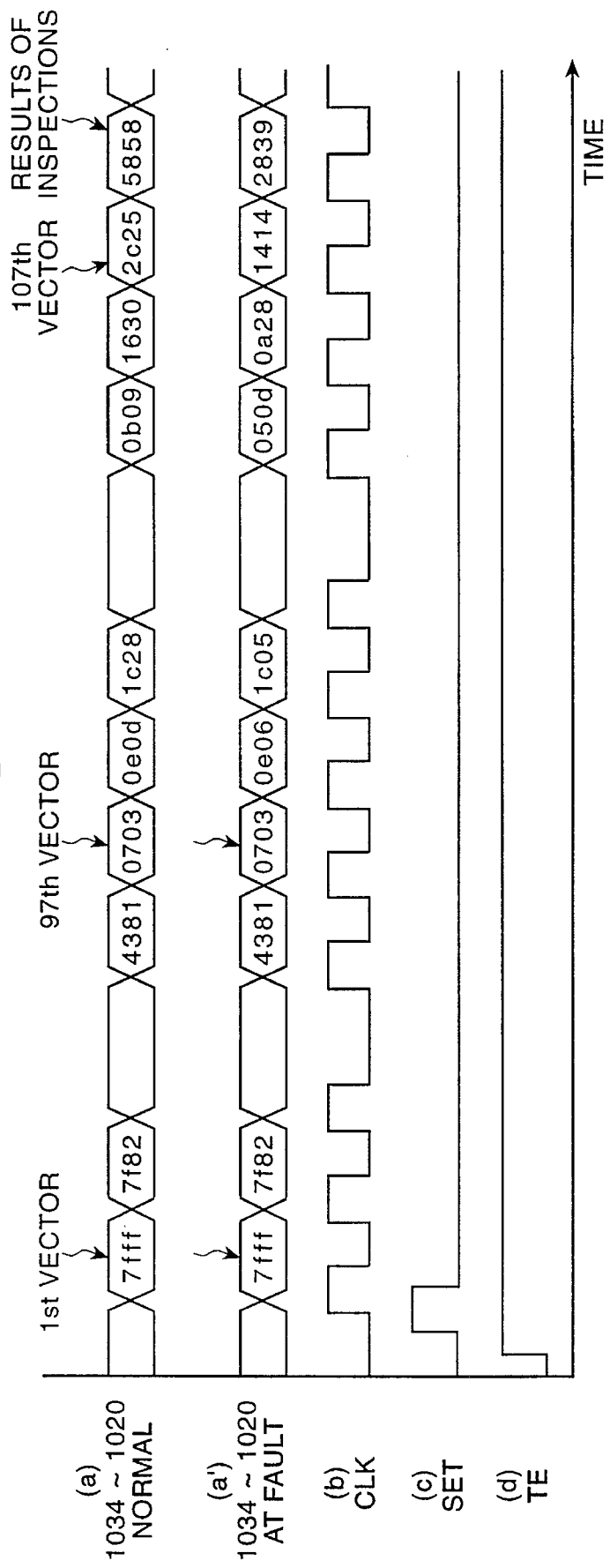
FIG. 35 illustrates the operation of the ninth embodiment, and in which an inspection is being carried out.

First, when a test enable signal TE goes high, ordinary input signal line NIN to the circuit under test 1001 is disconnected by switching circuits 1005. Fifteen such switching circuits 1005 are provided for each of the signal lines 1020–1034. At the same time, the input signal line NIN is connected with the testing circuit 1002, thus switching the mode of operation to test mode. Under this condition, 1 pulse of SET signal is produced from the control circuit 56 (not shown in FIG. 32) to supply data into the flip-flops equipped with setting or resetting terminals of the testing circuit 1002. In this example, all the flip-flops have setting terminals. Therefore, 15-bit "1..1" (7fff in hexadecimal notation) is entered. Thereafter, if the first clock pulse CLK is applied, the data 7fff held in the testing circuit 1002 is sent as a first set of testing data to the circuit under test 1001. This is illustrated as a first vector in FIG. 35. Immediately after a signal is entered into the circuit under test 1001, it performs a calculation. A first set of output data is produced to the output signal lines 1010–1016. When the next clock pulse arrives, the output data is held as new testing data 7f82, or a second vector, in the testing data-generating circuit of the testing circuit 1002.

Subsequently, whenever a new clock pulse is applied, testing data is supplied into the circuit under test 1001, thus carrying out a test. The testing data is successively updated. If the arithmetic logic unit of FIG. 24 (circuit under test 1001) is not at fault, when application of the 107th clock pulse is finished, i.e., when the 108th or subsequent clock pulse arrives, results of the final test (5858) are produced to the decision circuit, because previous calculation has shown that output data of the 107th vector completes the series of tests.

Figure 36:
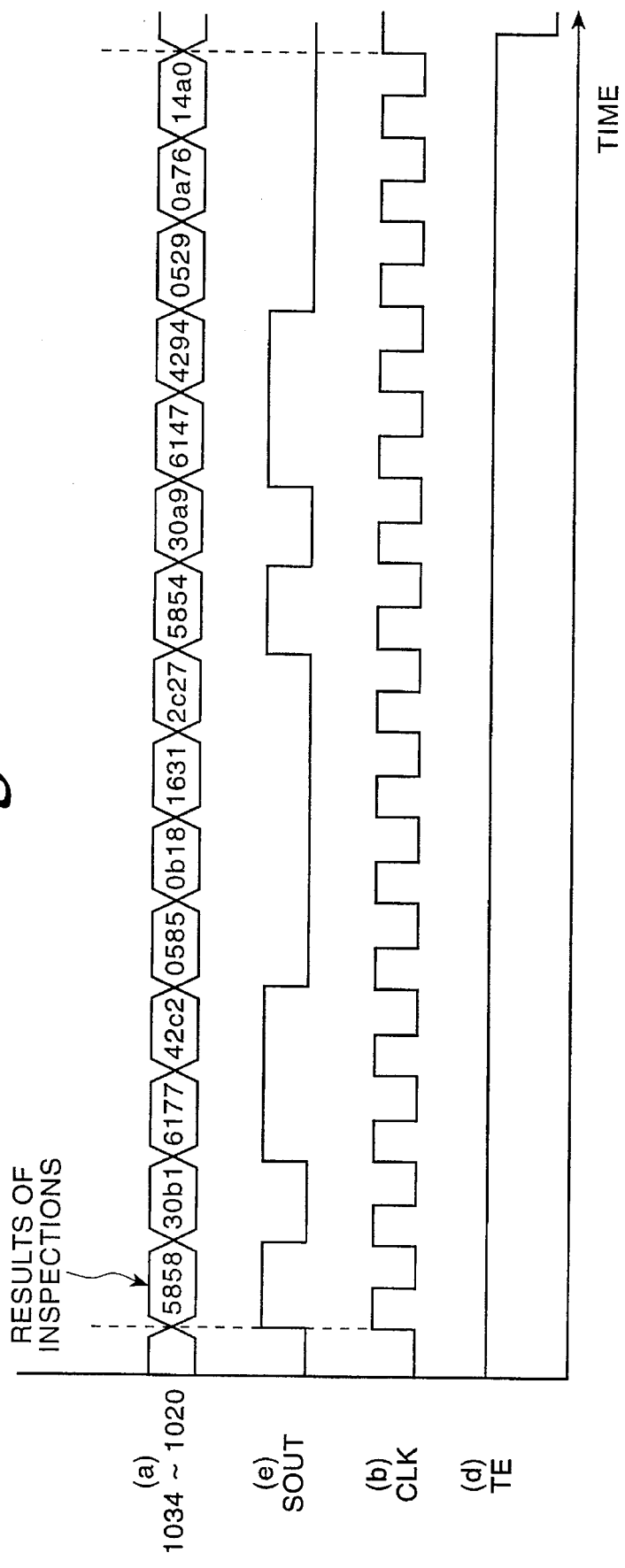
FIG. 36 is a time chart similar to FIG. 35, but in which the inspection is ended, and line (e) illustrates $S_{OUT}$.

The output indicating the results of the final test is sent as serial data from the output SOUT of the testing circuit 1002. That is, whenever a following clock pulse is applied, data held in the flip-flop F/F15 is delivered. Therefore, as shown in the chart of the output SOUT of FIG. 36(e), the results of test (5858) after cease of the 107th vector is produced as serial data. When all bits indicating the results of test are sent out, the test enable signal is made to go low, thus completing the series of tests. In this testing circuit 1002, the results of test (5858) are not simply produced from the output SOUT. Whenever a new clock pulse arrives, the result of calculation performed by the circuit under test 1001 is sent to the signal lines 1010–1016 of the testing circuit 1002. The exclusive-OR gates keep producing variations. Therefore, the serial data produced from the output SOUT and stored in the decision circuit does not always maintain the results of test (5858) from the circuit under test 1001. However, the value finally held in the decision circuit is already known as an expected value. Hence, the decision of the test is not hindered. The serial data 5858 from the output SOUT in FIG. 36(*e*) by chance agrees with the result of test 5858 from the testing circuit 1002 shown in FIG. 33.

Where a fault exists, the circuit operates in the manner described below. It is assumed that a fault exists in the circuit under test 1001. As indicated by signal line data of FIG. 35(*a*), when the 97th vector is applied, data indicating the fault appears in the result of a test. If the circuit is normal, the result of the test should be 0e0d, but the actual result is 0c06 due to the fault. This varied result of test is supplied as the next testing data into the circuit under test 1001. Therefore, the effect of the variation remains on the final 107th vector. In consequence, the results of the final test are different from results (2839 in FIG. 35) occurring in normal state. Thus, the circuit under test 1001 is found to be at fault. The probability that results of test are returned to normal values during the process is quite low. Furthermore, it is possible to infer such inconvenience to some extent by calculation. This undesirable situation can be circumvented by setting the initial values to appropriate values. In this way, the tests are not affected adversely.

The results of tests can be judged in a manner different from the above-described method. When the results of tests are held in the flip-flops, their values are sent to the output signal line NOUT of the circuit under test 1001. This makes it possible to read the results of test (5858). A decision may be made, using this value.

(Tenth Embodiment)

Figure 37:
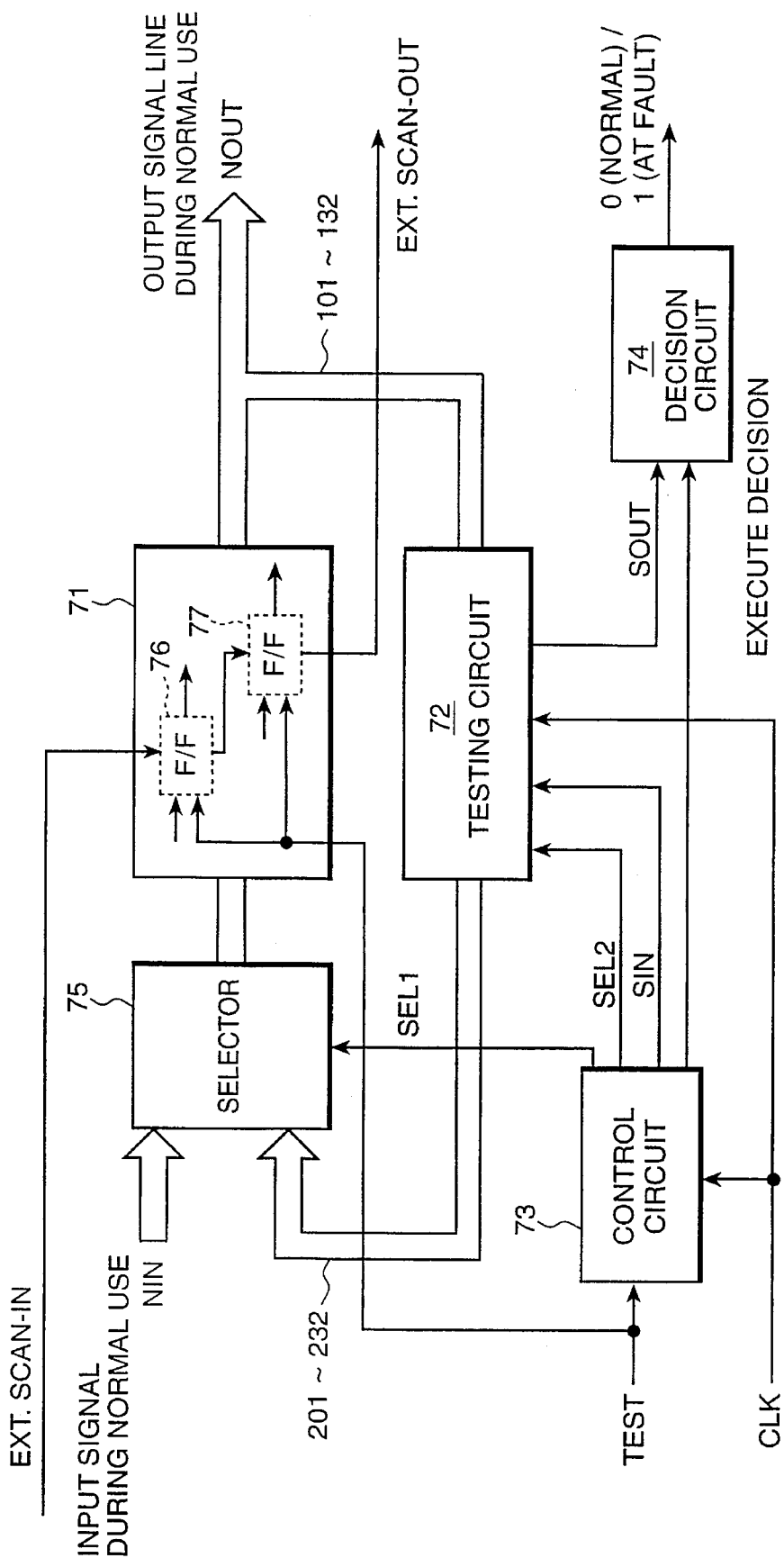
FIG. 37 is a diagram of a tenth embodiment of the invention.

In the tenth embodiment, as shown in FIG. 37, a circuit under test 71 has scan pass capabilities. Signal lines are connected so that a TEST signal and a SCAN-IN signal are applied to registers 76 and 77 (for simplicity, denoted by F/Fs) of the circuit under test 71. A SCAN-OUT signal is produced from these registers. In this case, when the TEST signal places the inspected circuit 71 in the test mode, data is entered from an external scan-in input terminal SCAN-IN to operate the registers 76 and 77 as shift registers. The values in the registers 76 and 77 are taken from an external scan-out terminal SCAN-OUT. In this way, the circuit under test 71 can be easily inspected. Although the circuit under test 71 cannot be readily inspected with the signal from the testing circuit 72, the LSI can be inspected by providing a few signal lines that facilitate the inspection. The operations for the inspection are the same as the operations described above. Signals produced during normal use flow through the input signal line NIN and through the output signal line NOUT shown in FIG. 37.

(Eleventh Embodiment)

Figure 38:
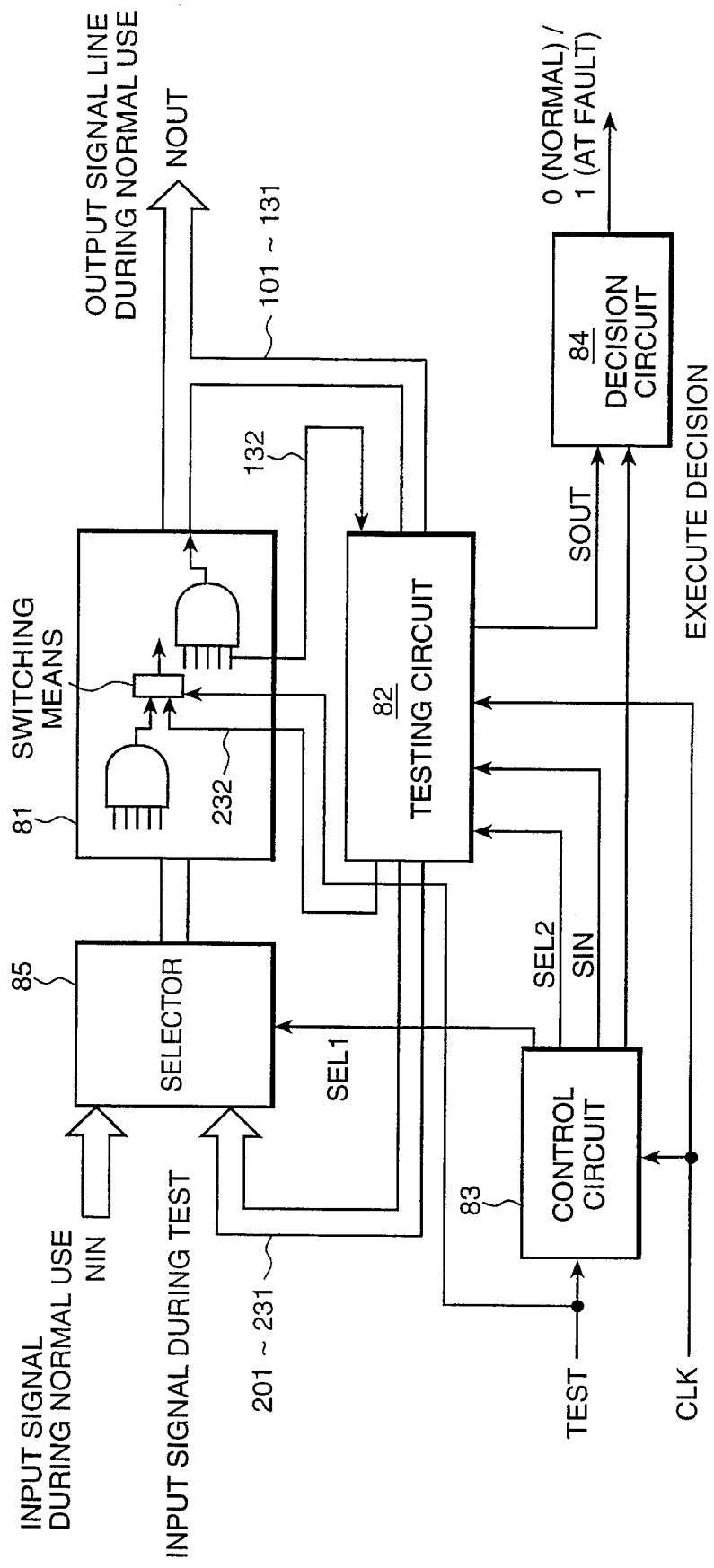
FIG. 38 is a diagram of an eleventh embodiment of the invention.

The eleventh embodiment is based on the same concept as the tenth embodiment. As shown in FIG. 38, signal lines 101–132 are included in a circuit under test 81. Of these signal lines 101–132, the signal line 132 has low test observability. This signal line 132 can be directly connected to a testing circuit 82. For example, the signal line 132 is located before a multi-input AND gate. In this way, inspections can be done easily. In addition, some of signal lines included in the circuit under test 81 have low test controllability. An input signal line 232 can be directly coupled to the testing circuit. For example, the signal line 232 is located after the multi-input AND gate. This facilitates inspections. In this case, in the testing mode, a switching means 234 (FIG. 33) is added to select the signal line 232 in response to the TEST signal. The connected lines are switched from signal lines which are used in normal use, and inspections are done. Therefore, even a circuit under test having such elements of low observability can be sufficiently inspected. The efficiency of inspection can be enhanced.

(Twelfth Embodiment)

In this embodiment, as shown in FIG. 39, a testing circuit 94 is connected with an internal bus 97 intrinsically included in an LSI via signal lines 601–632 and via signal lines 501–532 during inspection. During inspection, a control circuit 95 controls a connecting circuit included in the LSI and contained in plural circuits under test of the LSI, for example, to interconnect the first circuit under test 91 and the internal bus 97. Then, the testing circuit 94 inspects the circuit under test 91 by the same method as the method used in the ninth embodiment. Similarly, the circuits under test 92 and 93 are successively inspected. In the present embodiment, connecting circuits used in the circuits under test 91–93 operate as selecting means for selecting signals about testing data during inspection. In this structure, those portions connected to the internal bus 97 can be disconnected from a control line 98 going from the control circuit 95 to each circuit under test. Consequently, the testing circuit 94, the control circuit 95, and a decision circuit 96 can be easily fabricated as an external device. For example, this external device is a probe for inspecting an LSI. Furthermore, inspections can be quickly carried out.

As described in these embodiments of the present invention, in the novel self-testing circuit for an LSI, the output from a circuit under test is applied to a testing circuit. In response to the output from this testing circuit, new testing data to be applied to the circuit under test is new. The created testing data is supplied into the circuit under test. The circuit under test is inspected according to the generated testing data. Thus, the amount of data necessary for inspection can be reduced greatly. Therefore, the self-testing circuit can be easily fabricated without impairing the quality of the test. At the same time, the area of circuit for the self-testing can be reduced. Additionally, where such a self-testing circuit is connected from the outside, inspections can be easily carried out.

The present invention provides a semiconductor device having an inspecting function for accomplishing self-testing which permits inspection of the semiconductor device such as an LSI by making use of chaos theory. In this method, a feedback system is composed of a circuit under test and a testing circuit. This feedback system makes a chaotic system, whereby testing data is created. Inspections are done automatically. This testing method is based on a concept totally different from the concept of the conventional self-testing method. Experiments were made to detect faults in a 16-bit multiplier by this method. The inspection time was shortened by about 25% compared with the conventional method. The number of transistors forming an added circuit for testing was reduced by about 60%. In this way, the novel self-testing of a semiconductor device is suitable for inspection of a semiconductor device that is difficult to inspect such as a large-scale logic circuit.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An integrated circuit having a self-testing function, comprising:

a circuit under test having a logic circuit, said circuit under test receiving a first set of input test data as a set of testing data, and outputting a first set of output data corresponding to a result calculated by said logic circuit based on said first set of test data; and a testing circuit to which all of said first set of output data from said circuit under test is input as a second set of input data, said testing circuit automatically generating a second set of output data from said second set of input data, and providing said second set of output data to said circuit under test as said first set of test data, wherein output of testing data from said testing circuit to said circuit under test is performed repeatedly to carry out said self-testing function, said testing circuit comprising:

a testing data generating circuit comprising:
   input signal lines receiving said second set of input data;
   output signal lines to output said second set of output data from said testing circuit; and
   interconnections between said input signal lines and said output signal lines to rearrange data carried by said input and said output signal lines as said data flows through said testing circuit via said input signal lines and said output signal lines such that a pattern of data on said input signal lines differs from a pattern of data on said output signal lines; and
   a timing adjustment circuit controlling a timing at which said second set of output data is output from said timing circuit.

2. A self-testing circuit in a semiconductor integrated circuit adapted to perform a self-testing function on a circuit under test during which said circuit under test receives a series of test data and outputs a series of test result data based thereon, said self-testing circuit comprising:

a testing circuit including a data generating circuit and a flip-flop circuit actuated by a clock signal, said data generating circuit receiving initial test data corresponding to first test data in said series of test data if said self-testing function is initiated and receiving said series of test result data from said circuit under test if said self-testing function is being performed, said flip-flop circuit and said data generating circuit being operatively coupled to one another such that said flip-flop circuit receives an output from said data generating circuit and such that said flip-flop circuit and said data generating circuit define a linear feedback shift register, said linear feedback shift register outputting a portion of test data in said series of test data based on a portion of test result data in said series of test result data received from said circuit under test, said output of said flip-flop circuit being adapted to be operatively coupled to said circuit under test to provide said series of test data to said circuit under test;

a selecting circuit that provides an input signal to said circuit under test during normal operation and that provides said series of test data from said testing circuit to said circuit under test if said self-testing function is being performed;

a decision circuit that determines whether said circuit under test is operating within acceptable parameters based on testing data output from said testing circuit after said series of test result data have been received; and a control circuit for controlling said testing circuit, said selecting circuit and said decision circuit as said self-testing function is being performed.

3. An integrated circuit having a self-testing function as set forth in claim 1, wherein said testing circuit further comprises at least one inverter disposed in said output signal lines.

4. An integrated circuit having a self-testing function as set forth in claim 1, wherein a total number m of said output signal lines of said testing circuit for delivering said second set of output data to said circuit under test is greater than a total number n of said input signal lines, and wherein said testing circuit includes a data line expansion means for expanding said second set of input data so as to match said number m of said output signal lines.

5. An integrated circuit having a self-testing function as set forth in claim 1, wherein a total number m of said output signal lines of said testing circuit for delivering said second set of output data to said circuit under test is smaller than a total number n of said input signal lines, and wherein said testing circuit includes a data line reducing means for reducing said second set of input data so as to match said number m of said output signal lines.

6. An integrated circuit having a self-testing function as set forth in claim 4, wherein said data line expansion means doubly produces input data bits of said second set of input data entered into certain ones of said input signal lines to thereby increase output data bits of said second output data, and wherein said data expansion means includes conductive lines connected with said certain input signal lines.

7. An integrated circuit having a self-testing function as set forth in claim 5, wherein said reducing means includes a logic circuit coupled to at least one of said input signal lines, and wherein said logic circuit performs calculations so as to reduce output data bits of said second set of output data.

8. An integrated circuit having a self-testing function as set forth in claim 3, where said testing circuit includes a selector that selectively connects said output signal lines to said inverters.

9. An integrated circuit having a self-testing function as set forth in claim 1, further comprising a plurality of circuits under test, and a selecting circuit for selectively connecting one of said plurality of said circuits under test to said testing circuit.

10. An integrated circuit having a self-testing function as set forth in claim 1, wherein said circuit under test and said testing circuit together form a monolithic integrated circuit.

11. An integrated circuit having a self-testing function as set forth in claim 1, further comprising a decision means for comparing output data produced after said circuit under test is inspected with a reference value and judging whether said circuit under test is normal based on said comparison.

12. A self-testing circuit having a self-testing function as set forth in claim 2, wherein said data generating circuit comprises an exclusive-OR gate having an output that is operatively connected to an input of said flip-flop circuit and an input that receives said test result data from said circuit under test.

13. A self-testing circuit having a self-testing function as set forth in claim 12, wherein said data generating circuit further comprises a selector for selecting one of a first state in which said initial test data is entered into said flip-flop circuit, which defines a first state in said linear feedback shift register, and a second state in which said test result data from said circuit under test is entered into said flip-flop circuit.

14. A self-testing circuit having a self-testing function as set forth in claim 13, wherein said selector disconnects lines for entering a first test data in said series of test data after said first test data has been accepted and established in said testing circuit.

15. A self-testing circuit having a self-testing function as set forth in claim 2, wherein a plurality of said flip-flop circuits are operatively connected to one another so as to define a shift register that serially accepts only said first test data in said series of test data.

16. A self-testing circuit having a self-testing function as set forth in claim 2, wherein said decision circuit comprises a comparator circuit for comparing said test result data to expected values, and judging whether said circuit under test is normal based on a result of said comparison.

17. A self-testing circuit having a self-testing function as set forth in claim 2, wherein said circuit under test, said testing circuit, said control circuit, and said decision circuit are formed on one chip.

18. An integrated circuit having a self-testing function, comprising:

at least one circuit under test having a logic circuit, said circuit under test receiving a first set of input test data and producing a first set of output data indicating results of calculations performed by said log circuit based on said first set of input test data;

a testing circuit for receiving all of said first set of output data from said circuit under test as a second set of input data, automatically generating a second set of output data from said second set of input data, and repeatedly providing said second set of output data as testing data sets to said circuit under test such that a correlation coefficient between successively produced testing data sets is small, said testing circuit comprising:

a testing-data generating circuit which comprises:
   a plurality of input signal lines receiving said second set of input data; and
   a set of output signal data lines interconnected to said plurality of input signal lines such that said second set of input data is rearranged by said testing data generating circuit and output therefrom on said set of output signal data lines as said second set of output data, wherein said rearrangement is performed such that two continuous second input data within said second set of input data are rearranged so as to become discontinuous; and a decision circuit connected to said testing circuit, receiving said second set of output data, and which compares said second set of output data with a predetermined memory value to determine whether said circuit under test is acceptable.

19. An integrated circuit having a self-testing function, comprising:

at least one circuit under test having a logic circuit, said circuit under test receiving a first set of input test data and producing a first set of output data indicating results of calculations performed by said logic circuit based on said first set of input test data;

a testing circuit for receiving all of said first set of output data from said circuit under test as a second set of input data, automatically generating a second set of output data from said second set of input data, and repeatedly providing said second set of output data as testing data sets to said circuit under test such that a correlation coefficient between successively produced testing data sets is small, said testing circuit comprising:

a plurality of input signal lines receiving said second set of input data;

a set of output signal data lines operatively interconnected to said input signal lines; and an inverter circuit connected to a first input signal line in said plurality of input signal lines to cause second input data flowing through said first input signal lines to be inverted, wherein said set of output signal data lines are operatively interconnected to said input signal lines including said first signal line such that said testing circuit outputs said second set of output data in which a specific second input data within said second set of input data is inverted; and a decision circuit connected to said testing circuit, receiving said second set of output data, and comparing said second set of output data with a predetermined memory value to determine whether said circuit under test is acceptable.

20. A self-testing circuit as set forth in claim 2, wherein said testing circuit includes a plurality of flip-flops all of which are actuated by said clock signal and a plurality of data generating circuits, wherein an output of each data generating circuit is operatively coupled to an input of a unique flip-flop circuit so that each data generating provides its output to one flip-flop circuit, said plurality of flip-flops and said plurality of data generating circuit defining said linear feedback shift register.

21. An integrated circuit having a self-testing function, comprising:

an circuit under test that includes a logic circuit, input signal lines receiving a set of input test data, and output signal lines providing a set of output test data corresponding to a result calculated by said logic circuit based on said set of input test data; and a testing circuit carrying out a process of receiving an entirety of said set of output test data from said circuit under test, automatically generating test data based on said set of output test data received from said circuit under test, and providing said test data to said circuit under test as said input test data, wherein said process of receiving said set of output test data, automatically generating test data and providing said test data as said input test data to said circuit under test is performed repeatedly by said testing circuit such that each time said process is repeated said test data output by said testing circuit and provided to said circuit under test differs from said test data generated by said testing circuit in an immediately preceding cycle, said testing circuit comprising:

a timing adjustment circuit operatively connected to said output signal lines of said circuit under test, said timing adjustment circuit controlling a timing at which said output test data advances through said testing circuit; and a testing data generating circuit comprising:
   input signal lines operatively connected to said timing adjustment circuit to receive outputs therefrom;
   output signal lines operatively connected to said circuit under test; and
   interconnections between said input signal lines and said output signal lines that rearrange a signal from said timing adjustment circuit so that said test data having a pattern that differs from test data generated during said previous cycle is provided to said circuit under test as said input test data.

22. An integrated circuit having a self-testing function as set forth in claim 1, wherein when said circuit under test produces said first set of output data Y according to said first set of test data X and said testing circuit generates said second set of output data Z from said first set of output data Y and supplies said second set of output data Z back to said circuit under test, the following conditions are satisfied:

(A) a function used when said first set of output data Y from said circuit under test with respect to said data first set of test data X is regarded as a mapping transformation is one of a one to one mapping and an onto mapping given by Y=f (X) within ranges of possible values of said first set of test data X and said first set of output data Y;

(B) a function of said second set of output data Z created by said circuit under test is one of a one to one mapping and an onto mapping given by Z=g (Y); and (C) a composite function given by Z=g (f (X))=h (X) has a discontinuity and exhibits a relation given by $|h(x_1)-h(x_2)|>|x_1-x_2|$, wherein $x_1$ and $x_2$ are very close to each other within a range of said first set of test data X and is an onto function of second set of output data Z.

* * * * *